US012488755B2

(12) United States Patent
Cao et al.

(10) Patent No.: US 12,488,755 B2
(45) Date of Patent: Dec. 2, 2025

(54) DISPLAY PANEL, PIXEL REPAIR METHOD, AND DISPLAY APPARATUS

(71) Applicant: Hubei Yangtze Industrial Innovation Center Of Advanced Display Co., Ltd., Wuhan (CN)

(72) Inventors: Leilei Cao, Wuhan (CN); Huifang Zhou, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 0 days.

(21) Appl. No.: 18/882,723

(22) Filed: Sep. 11, 2024

(65) Prior Publication Data

US 2025/0006128 A1 Jan. 2, 2025

(51) Int. Cl.
*G09G 3/3233* (2016.01)

(52) U.S. Cl.
CPC ... *G09G 3/3233* (2013.01); *G09G 2300/0426* (2013.01); *G09G 2300/0842* (2013.01); *G09G 2300/0861* (2013.01); *G09G 2310/08* (2013.01); *G09G 2320/0233* (2013.01); *G09G 2320/0247* (2013.01); *G09G 2330/08* (2013.01); *G09G 2330/10* (2013.01)

(58) Field of Classification Search
None
See application file for complete search history.

(56) References Cited

U.S. PATENT DOCUMENTS

| 10,872,559 | B2* | 12/2020 | Lee | G09G 3/32 |
| 2016/0133195 | A1* | 5/2016 | Park | G09G 3/3225 345/694 |
| 2016/0217735 | A1* | 7/2016 | Park | G09G 3/3233 |
| 2016/0218155 | A1* | 7/2016 | Park | H10K 59/131 |
| 2017/0316737 | A1* | 11/2017 | Park | G09G 3/3208 |
| 2021/0020729 | A1* | 1/2021 | Kitakado | G09F 9/30 |
| 2024/0164162 | A1* | 5/2024 | Chai | H10K 59/131 |

* cited by examiner

*Primary Examiner* — Matthew Yeung
(74) *Attorney, Agent, or Firm* — Wiersch Law Group

(57) ABSTRACT

A display panel, a pixel repair method, and a display apparatus. The display panel includes N1 pixel driving circuit rows arranged along a first direction and located on a side of a substrate, repair lines, and repair driving circuits. Each of the pixel driving circuit rows includes a plurality of pixel driving circuits arranged along a second direction. Along a direction perpendicular to a plane where the substrate is located, each of the repair lines at least partially overlaps with one of the repair driving circuits and also the pixel driving circuits. Each of the repair driving circuit includes a repair circuit including at least two transistors and a second capacitor, and a first capacitor. A capacitance of the first capacitor is greater than or equal to a capacitance of the second capacitor. A number of first capacitors is N2, both N1 and N2 are positive integers, and N2<2N1.

24 Claims, 28 Drawing Sheets

DISPLAY PANEL, PIXEL REPAIR METHOD, AND DISPLAY APPARATUS

CROSS-REFERENCE TO RELATED APPLICATIONS

The present disclosure claims priority to Chinese Patent Application No. 202410822766.1, filed on Jun. 24, 2024, the content of which is incorporated herein by reference in its entirety.

TECHNICAL FIELD

The present disclosure relates to the field of display technology and, in particular, to a display panel, a pixel repair method, and a display apparatus.

BACKGROUND

With the continuous development of display technology, consumers' requirements for display screens are constantly increasing. At present, self-luminous display panels, including organic light-emitting display screens, have been developed rapidly. On this basis, display technologies such as 3D display, touch display technology, curved display, ultra-high-resolution display, and privacy protection display have emerged continuously.

For a self-luminous display panel, pixel driving circuits need to be provided within the display panel to drive light-emitting elements to emit light. If a pixel driving circuit is defective, its corresponding light-emitting element will not be able to display the correct brightness, such that a display defect exists on the display panel, affecting the display effect.

SUMMARY

In view of this, the present disclosure provides a display panel, a pixel repair method, and a display apparatus, so that when a pixel driving circuit is abnormal and cannot drive a light-emitting element normally, a repair driving circuit is utilized to supply power to the light-emitting element that should be driven by the pixel driving circuit through a repair line, improving the reliability of the display panel.

In a first aspect, an embodiment of the present disclosure provides a display panel including: a substrate; N1 pixel driving circuit rows arranged along a first direction and located on a side of the substrate; a plurality of light-emitting elements; repair lines; and repair driving circuits. Each of the pixel driving circuit rows includes a plurality of pixel driving circuits arranged along a second direction, and the first direction intersects with the second direction. Each of the plurality of light-emitting elements is electrically connected to one of the pixel driving circuits. Along a direction perpendicular to a plane where the substrate is located, each of the repair lines at least partially overlaps with one of the repair driving circuits and also the pixel driving circuits. Each of the repair driving circuits includes a repair circuit and a first capacitor that are electrically connected. The repair circuit includes at least two transistors and a second capacitor. A capacitance of the first capacitor is greater than or equal to a capacitance of the second capacitor. A number of first capacitors is N2, where both N1 and N2 are positive integers, and N2<2N1.

In a second aspect, an embodiment of the present disclosure provides a pixel repair method for a display panel, which is applied to the above-mentioned display panel, including: determining a defective pixel; disconnecting an electrical connection between the light-emitting element and the pixel driving circuit of the defective pixel; and electrically connecting the light-emitting element of the defective pixel to the repair line provided corresponding to the repair driving circuit.

In a third aspect, an embodiment of the present disclosure provides a display apparatus including the above-mentioned display panel.

BRIEF DESCRIPTION OF DRAWINGS

To describe the technical solutions in the embodiments of the present disclosure more clearly, the following will briefly describe the accompanying drawings required to be used in the embodiments. Apparently, the accompanying drawings in the following description are merely some embodiments of the present disclosure, and those of ordinary skill in the art may still derive other accompanying drawings from these accompanying drawings without creative efforts.

DESCRIPTION OF EMBODIMENTS

For a better understanding of the technical solutions of the present disclosure, the following describes in detail the embodiments of the present disclosure in conjunction with the accompanying drawings.

It should be clear that the described embodiments are merely some but not all of the embodiments of the present disclosure. Based on the embodiments of the present disclosure, all other embodiments obtained by a person of ordinary skill in the art without creative efforts fall within the protection scope of the present disclosure.

The terms used in the embodiments of the present disclosure are only for the purpose of describing specific embodiments, and are not intended to limit the present disclosure. Unless otherwise specified in the context, words, such as "a", "the", and "this", in a singular form in the embodiments of the present disclosure and the appended claims include plural forms.

It should be understood that the term "and/or" used herein merely describes associations between associated objects, and it indicates three types of relationships, for example, A and/or B may indicate that A exists alone, A and B coexist, or B exists alone. In addition, the character "/" herein generally indicates that the associated objects before and after it are in an "or" relationship.

Figure 1:
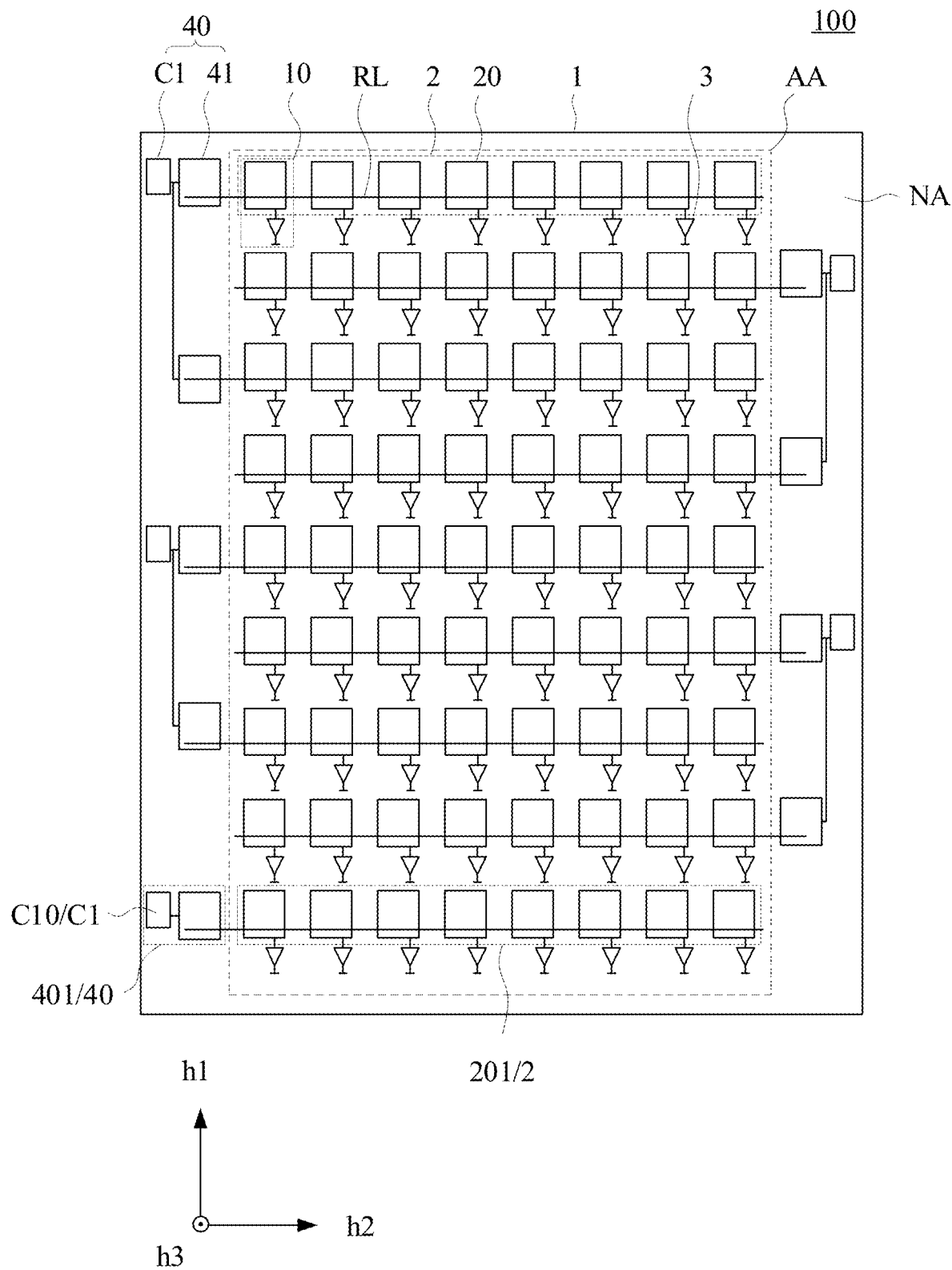
FIG. 1 is a schematic diagram of a display panel provided by an embodiment of the present disclosure.

An embodiment of the present disclosure provides a display panel, as shown in FIG. 1, which is a schematic diagram of the display panel provided by the embodiment of the present disclosure. The display panel 100 includes a substrate 1, which includes a display region AA and a non-display region NA. The display region AA includes a plurality of pixels 10. Exemplarily, each of the pixels 10 includes a pixel driving circuit 20 and a light-emitting element 3 that are electrically connected.

The display panel 100 includes N1 pixel driving circuit rows 2 arranged along a first direction h1, and the N1 pixel driving circuit rows 2 are located on a side of the substrate 1. Each of the pixel driving circuit rows 2 includes a plurality of the above-mentioned pixel driving circuits 20 arranged along a second direction h2. The first direction h1 intersects with the second direction h2, and the intersection of the first direction h1 and the second direction h2 defines a plane where the substrate 1 is located. FIG. 1 schematically illustrates the first direction h1 and the second direction h2 as being perpendicular to each other.

As shown in FIG. 1, the display panel 100 further includes repair lines RL and repair driving circuits 40. Along a direction h3 perpendicular to the plane where the substrate 1 is located, each of the repair lines RL at least partially overlaps with one of the repair driving circuits 40 and the pixel driving circuits 20. Each of the repair driving circuits 40 is configured to drive, when a pixel driving circuit 20 is abnormal, a light-emitting element 3 in place of the abnormal pixel driving circuit 20. Exemplarily, as shown in FIG. 1, the repair lines RL may extend along the second direction h2.

Each of the repair lines RL at least partially overlapping with one of the repair driving circuits 40 along the direction h3 perpendicular to the plane where the substrate 1 is located indicates that before a repair process, the respective structures of the repair line RL and the repair driving circuit 40 may be insulated from each other. After the repair process, for example, by employing laser irradiation onto the region where the repair line RL and the repair driving circuit 40 overlap, it is possible to remove an insulating layer between parts of the structures of the repair line RL and the repair driving circuit 40, enabling the parts of the structures of the repair line RL and the repair driving circuit 40 to electrically connect to each other. Similarly, each of the repair lines RL at least partially overlapping with the pixel driving circuits 20 along the direction h3 perpendicular to the plane where the substrate 1 is located indicates that before a repair process, the respective structures of the repair line RL and the pixel driving circuits 20 may be insulated from each other. After the repair process, for example, by employing laser irradiation onto the region where the repair line RL and the pixel driving circuits 20 overlap, it is possible to remove an insulating layer between parts of the structures of the repair line RL and the pixel driving circuits 20, enabling the parts of the structures of the repair line RL and the pixel driving circuits 20 to electrically connect to each other.

Or, in an embodiment of the present disclosure, it is possible to make the repair line RL and the repair driving circuit 40 electrically connected at the position where they overlap during the manufacturing of the display panel 100, thereby eliminating the step of employing laser irradiation to electrically connect the repair line RL and the repair driving circuit 40 during a subsequent repair, to simplify the repair process.

It should be noted that FIG. 1 shows that along the direction h3 perpendicular to the plane where the substrate 1 is located, the light-emitting element 3 and the pixel driving circuit 20 do not overlap. However, this is merely an illustration to represent the electrical connection relationship between the light-emitting element 3 and the pixel driving circuit 20 more clearly. In fact, along the direction h3 perpendicular to the plane where the substrate 1 is located, a first electrode of the light-emitting element 3 may be provided to at least partially overlap with at least one pixel driving circuit 20, and the first electrode may be the anode of the light-emitting element 3.

Figure 2A:
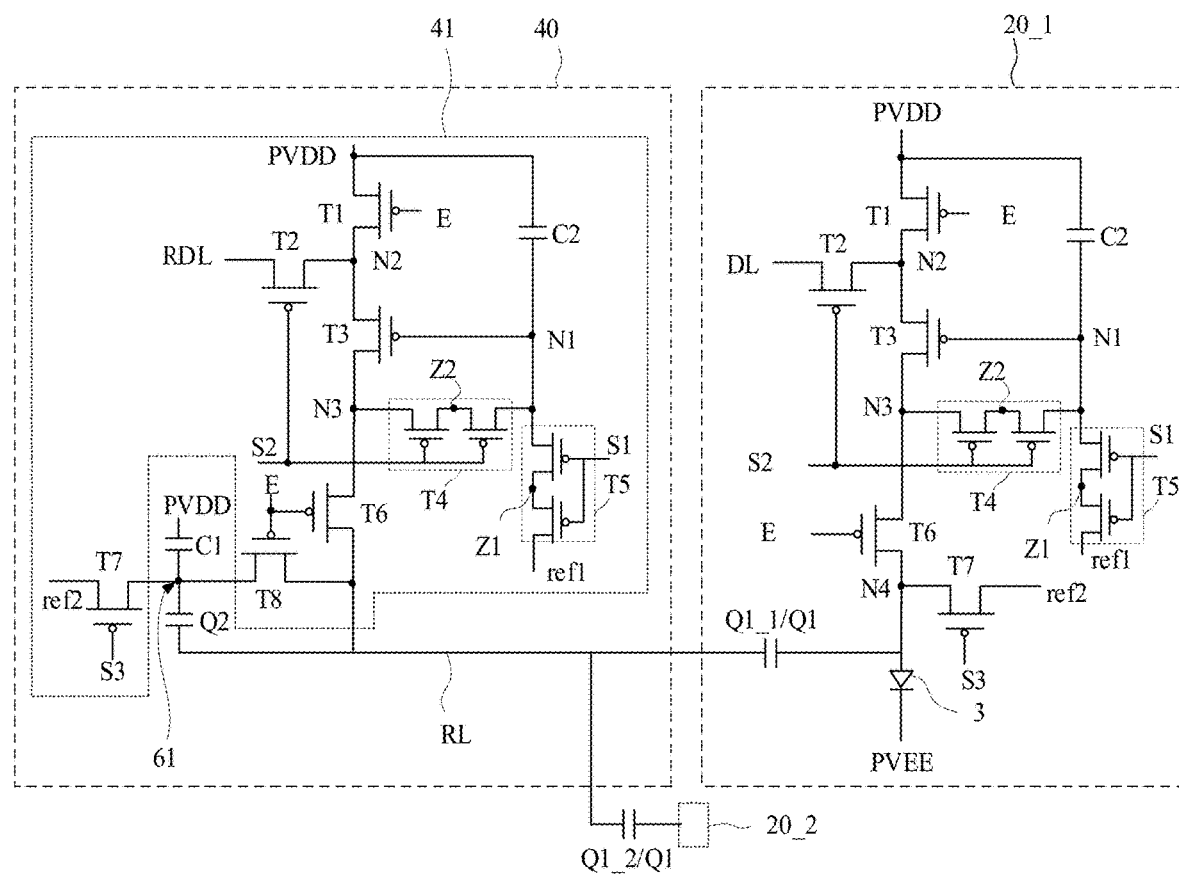
FIG. 2A is a schematic circuit diagram of a pixel driving circuit and a repair driving circuit provided by an embodiment of the present disclosure.
Figure 2B:
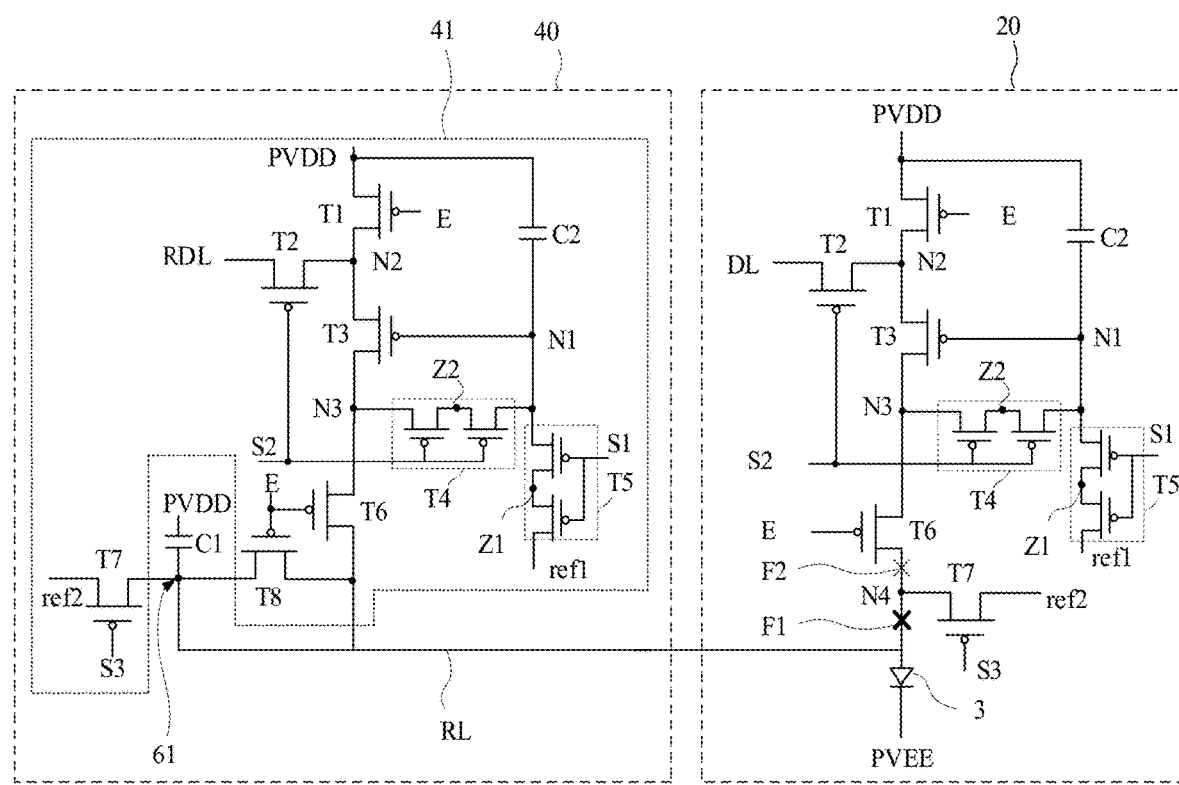
FIG. 2B is a schematic circuit diagram of a pixel driving circuit and a repair driving circuit provided by another embodiment of the present disclosure.

As shown in conjunction with FIGS. 1, 2A, and 2B, FIGS. 2A and 2B are schematic circuit diagrams of two pixel driving circuits and a repair driving circuit provided by embodiments of the present disclosure. The repair driving circuit in FIG. 2A does not participate in pixel repair, and the repair driving circuit in FIG. 2B participates in pixel repair. The repair driving circuit 40 includes a repair circuit 41 and a first capacitor C1 that are electrically connected. In the embodiments of the present disclosure, the repair circuit 41 includes at least two transistors and a second capacitor C2.

Figure 3:
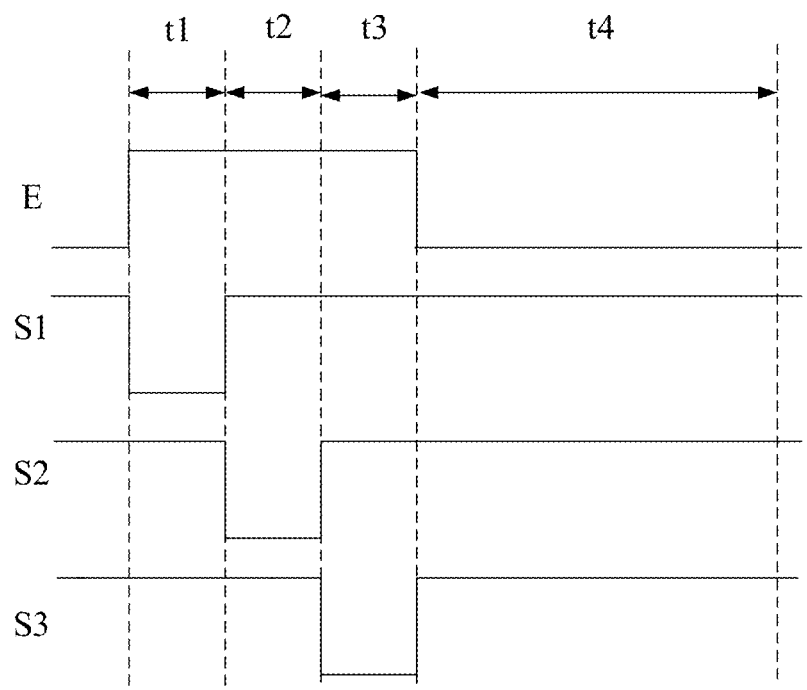
FIG. 3 is a schematic operating timing diagram of a pixel driving circuit provided by an embodiment of the present disclosure.
Figure 4:
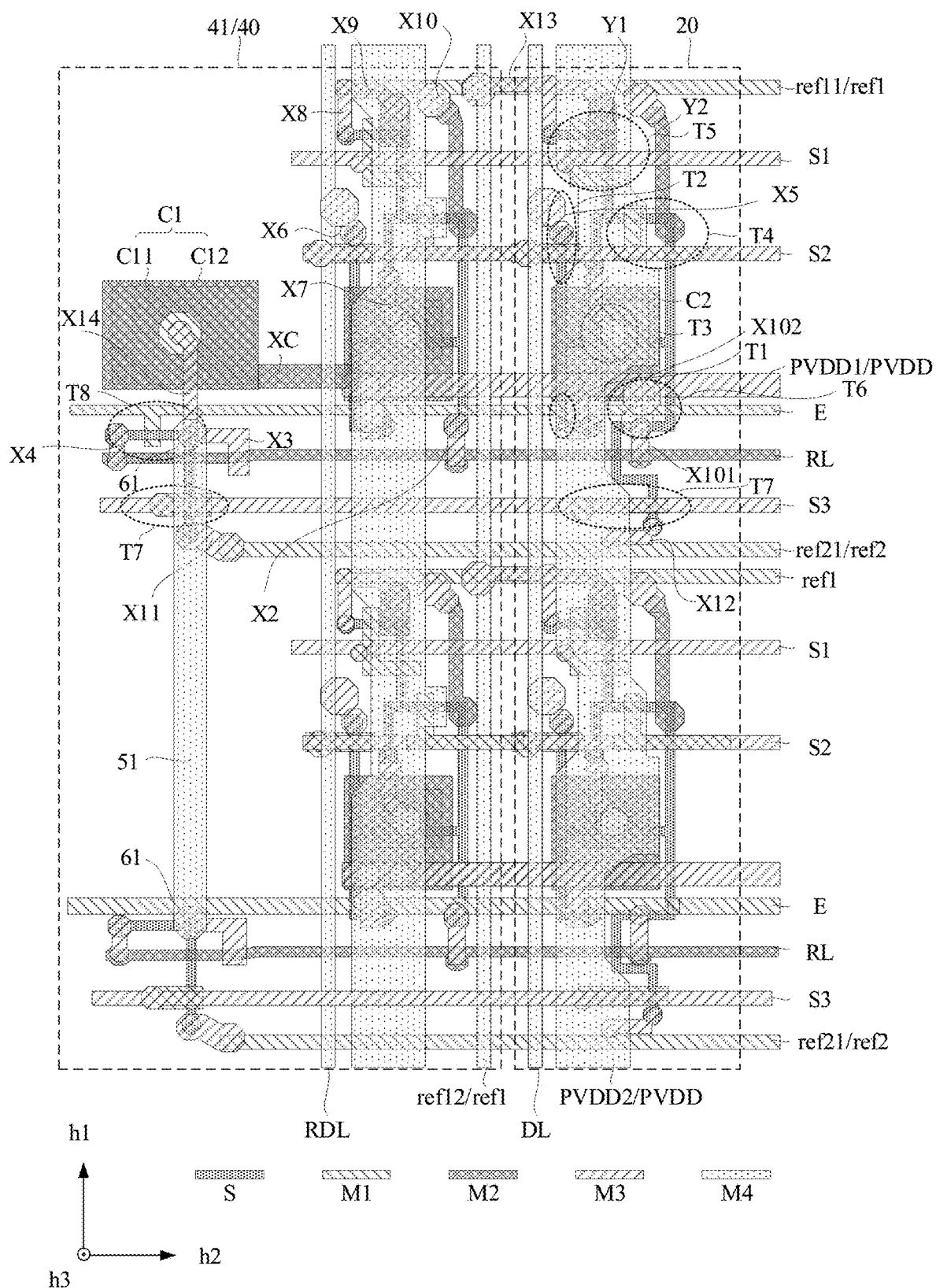
FIG. 4 is a layout diagram of a pixel driving circuit and a repair driving circuit provided by an embodiment of the present disclosure.

Optionally, as shown in FIGS. 2A, 2B, 3, and 4, FIG. 3 is a schematic operating timing diagram of a pixel driving circuit provided by an embodiment provided by the present disclosure, and FIG. 4 is a layout diagram of a pixel driving circuit and a repair driving circuit provided by an embodiment of the present disclosure. The display panel 100 further includes a light emission control line E, a first power supply voltage line PVDD, a first scan line S1, a second scan line S2, a third scan line S3, a repair data line RDL, a data line DL, a first reset voltage line ref1, and a second reset voltage line ref2.

As shown in FIGS. 2A, 2B, and 4, the pixel driving circuit 20 includes a first light emission control transistor T1, a data writing transistor T2, a drive transistor T3, a threshold compensation transistor T4, a first reset transistor T5, a second light emission control transistor T6, a second reset transistor T7, and a second capacitor C2.

A first electrode of the first light emission control transistor T1 is electrically connected to the first power supply voltage line PVDD, a second electrode of the first light emission control transistor T1 is electrically connected to a first electrode of the drive transistor T3, and a gate of the first light emission control transistor T1 is electrically connected to the light emission control line E.

A first electrode of the data writing transistor T2 is electrically connected to the data line DL. A second electrode of the data writing transistor T2 is electrically connected to the first electrode of the drive transistor T3, and a gate of the data writing transistor T2 is electrically connected to the second scan line S2.

A first electrode of the threshold compensation transistor T4 is electrically connected to a second electrode of the drive transistor T3, a second electrode of the threshold compensation transistor T4 is electrically connected to a gate of the drive transistor T3, and a gate of the threshold compensation transistor T4 is electrically connected to the second scan line S2.

A first electrode of the first reset transistor T5 is electrically connected to the first reset voltage line ref1, a second electrode of the first reset transistor T5 is electrically connected to the gate of the drive transistor T3, and a gate of the first reset transistor T5 is electrically connected to the first scan line S1.

A gate of the second light emission control transistor T6 is electrically connected to the light emission control line E, and a first electrode of the second light emission control transistor T6 is electrically connected to the second electrode of the drive transistor T3. When a pixel driving circuit 20 is normal, a second electrode of the second light emission control transistor T6 is electrically connected to a first electrode of the light-emitting element 3. When the pixel driving circuit 20 is abnormal and the repair driving circuit 40 is utilized to participate in pixel repair, the electrical connection between the second electrode of the second light emission control transistor T6 and the first electrode of the light-emitting element 3 may be disconnected, and the repair driving circuit 40 is electrically connected to the first electrode of the light-emitting element 3. The pixel repair process will be explained in detail below.

A gate of the second reset transistor T7 is electrically connected to the third scan line S3, and a first electrode of the second reset transistor T7 is electrically connected to the second reset voltage line ref2. When a pixel driving circuit 20 is normal, a second electrode of the second reset transistor T7 is electrically connected to the first electrode of the light-emitting element 3. When the pixel driving circuit 20 is abnormal and the repair driving circuit 40 is utilized to participate in pixel repair, the electrical connection between the second electrode of the second reset transistor T7 and the first electrode of the light-emitting element 3 may be disconnected, or the electrical connection between the second electrode of the second reset transistor T7 and the first electrode of the light-emitting element 3 may be maintained while the connection between the second electrode of the second light emission control transistor T6 and the first electrode of the second reset transistor T7 is disconnected.

A first plate of the second capacitor C2 is electrically connected to the gate of the drive transistor T3, and its second plate is electrically connected to the first power supply voltage line PVDD.

A second electrode of the light-emitting element 3 is electrically connected to the second power supply voltage line PVEE. Exemplarily, the first electrode of the light-emitting element 3 may be its anode, and the second electrode of the light-emitting element 3 may be its cathode.

The gate of the drive transistor T3 is electrically connected to a first node N1, its first electrode is electrically connected to a second node N2, and its second electrode is electrically connected to a third node N3. The first electrode of the light-emitting element 3 is electrically connected to a fourth node N4.

During the operation of the pixel driving circuit 20, as shown in conjunction with FIGS. 2A, 2B, and 3, the operation process of the pixel driving circuit 20 includes a first reset phase t1, a charging phase t2, a second reset phase t3, and a light emission phase t4.

In the first reset phase t1, the first scan line S1 controls the first reset transistor T5 to be turned on, and a first reset voltage provided by the first reset voltage line ref1 resets the first node N1 through the first reset transistor T5. In the charging phase t2, the second scan line S2 controls the data writing transistor T2 and the threshold compensation transistor T4 to be turned on, and a data voltage Vdata provided by the data line DL is written into the second node N2 through the data writing transistor T2 of the pixel driving circuit 20. In this phase, the drive transistor T3 is turned on. The potential of the first node N1 changes continuously until the potential of the first node N1 changes to $V_{N1}=Vdata-|Vth|$, which is maintained by the second capacitor C2. Vdata is the data voltage provided by the data line DL, and Vth is the threshold voltage of the drive transistor T3. In the second reset phase t3, the third scan line S3 controls the second reset transistor T7 to be turned on, and a second reset voltage provided by the second reset voltage line ref2 resets the fourth node N4 through the second reset transistor T7. In the light emission phase t4, the first light emission control transistor T1, the second light emission control transistor T6, and the drive transistor T3 are turned on, a current path between the first power supply voltage line PVDD and the second power supply voltage line PVEE conducts, and the light-emitting element 3 electrically connected to the pixel driving circuit 20 is lighted up.

As shown in FIGS. 2A, 2B, and 4, the repair driving circuit 40 includes a first light emission control transistor T1, a data writing transistor T2, a drive transistor T3, a threshold compensation transistor T4, a first reset transistor T5, a second light emission control transistor T6, a second reset transistor T7, and a second capacitor C2.

A first electrode of the first light emission control transistor T1 is electrically connected to the first power supply voltage line PVDD, a second electrode of the first light emission control transistor T1 is electrically connected to a first electrode of the drive transistor T3, and a gate of the first light emission control transistor T1 is electrically connected to the light emission control line E.

A first electrode of the data writing transistor T2 is electrically connected to the repair data line RDL. A second electrode of the data writing transistor T2 is electrically connected to the first electrode of the drive transistor T3, and a gate of the data writing transistor T2 is electrically connected to the second scan line S2.

A first electrode of the threshold compensation transistor T4 is electrically connected to a second electrode of the drive transistor T3, a second electrode of the threshold compensation transistor T4 is electrically connected to a gate of the drive transistor T3, and a gate of the threshold compensation transistor T4 is electrically connected to the second scan line S2.

A first electrode of the first reset transistor T5 is electrically connected to the first reset voltage line ref1, a second electrode of the first reset transistor T5 is electrically connected to the gate of the drive transistor T3, and a gate of the first reset transistor T5 is electrically connected to the first scan line S1.

A gate of the second light emission control transistor T6 is electrically connected to the light emission control line E, and a first electrode of the second light emission control transistor T6 is electrically connected to the second electrode of the drive transistor T3. When a repair driving circuit 40 participates in pixel repair, a first electrode of the light-emitting element 3 and a second electrode of the second light emission control transistor T6 are both electrically connected to the repair line RL.

Optionally, the first electrode of the light-emitting element 3 may be electrically connected to the repair line RL through a first transfer connection structure. Along the direction h3 perpendicular to the plane where the substrate 1 is located, the first transfer connection structure, which will be explained below, may at least partially overlap with the first electrode of the light-emitting element 3 and the repair line RL, respectively.

Optionally, a second electrode of the second light emission control transistor T6 may be electrically connected to the repair line RL through a second transfer connection structure. Along the direction h3 perpendicular to the plane where the substrate 1 is located, the second transfer connection structure, which will be further explained below, may at least partially overlap with the second electrode of the second light emission control transistor T6 and the repair line RL.

A gate of the second reset transistor T7 is electrically connected to the third scan line S3, and a first electrode of the second reset transistor T7 is electrically connected to the second reset voltage line ref2. When a repair driving circuit 40 participates in pixel repair, a second electrode of the second reset transistor T7 is electrically connected to the repair line RL. Optionally, the second electrode of the second reset transistor T7 may be electrically connected to the repair line RL through a third transfer connection structure. Along the direction h3 perpendicular to the plane where the substrate 1 is located, the third transfer connection structure, which will be explained below, may at least partially overlap with the second electrode of the second reset transistor T7 and the repair line RL.

A first plate of the second capacitor C2 is electrically connected to the gate of the drive transistor T3, and its second plate is electrically connected to the first power supply voltage line PVDD.

Figure 5:
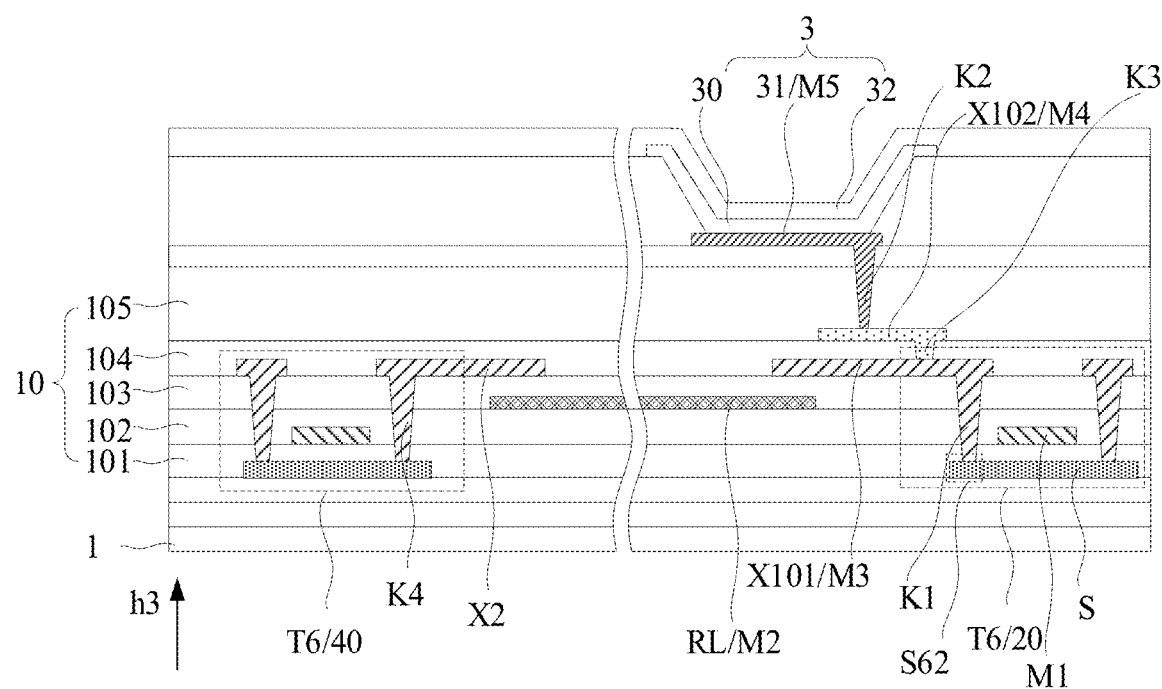
FIG. 5 is a schematic sectional diagram of a display panel provided by an embodiment of the present disclosure.

Exemplarily, as shown in FIG. 5, which is a schematic sectional diagram of a display panel provided by an embodiment of the present disclosure, the display panel includes a substrate 1 and a driving circuit layer 10. The driving circuit layer 10 includes the above-mentioned pixel driving circuits 20 and repair driving circuits 40. The above-mentioned light-emitting elements 3 are located on a side of the driving circuit layer 10 away from the substrate 1.

Exemplarily, the driving circuit layer 10 includes an active layer S, a first insulating layer 101, a first conductor layer M1, a second insulating layer 102, a second conductor layer M2, a third insulating layer 103, a third conductor layer M3, a fourth insulating layer 104, a fourth conductor layer M4, and a fifth insulating layer 105, which are stacked in sequence.

The active layer S is located on a side of the substrate 1, the first insulating layer 101 is located on a side of the active layer S away from the substrate 1, the first conductor layer M1 is located on a side of the first insulating layer 101 away from the active layer S, the second insulating layer 102 is located on a side of the first conductor layer M1 away from the active layer S, the second conductor layer M2 is located on a side of the second insulating layer 102 away from the first conductor layer M1, the third insulating layer 103 is located on a side of the second conductor layer M2 away from the second insulating layer 102, the third conductor layer M3 is located on a side of the third insulating layer 103 away from the second conductor layer M2, the fourth insulating layer 104 is located on a side of the third conductor layer M3 away from the third insulating layer 103, the fourth conductor layer M4 is located on a side of the fourth insulating layer 104 away from the third conductor layer M3, and the fifth insulating layer 105 is located on a side of the fourth conductor layer M4 away from the fourth insulating layer 104.

The light-emitting element 3 includes a first electrode, a light-emitting layer 30, and a second electrode 32. The first electrode is located on a side of the fifth insulating layer 105 away from the substrate 1. Optionally, the first electrode includes an anode 31, and the second electrode 32 includes a cathode.

Exemplarily, as shown in conjunction with FIGS. 2A, 2B, 4, and 6, FIG. 6 is a top-view schematic diagram of an active layer provided by an embodiment of the present disclosure. The active layer S includes a first channel region S10, a first doped region S11 and a second doped region S12 located on both sides of the first channel region S10, a second channel region S20, a third doped region S21 and a fourth doped region S22 located on both sides of the second channel region S20, a third channel region S30, a fifth doped region S31 and a sixth doped region S32 located on both sides of the third channel region S30, a fourth channel region S40, a seventh doped region S41 and an eighth doped region S42 located on both sides of the fourth channel region S40, a fifth channel region S50, a ninth doped region S51 and a tenth doped region S52 located on both sides of the fifth channel region S50, a sixth channel region S60, an eleventh doped region S61 and a twelfth doped region S62 located on both sides of the sixth channel region S60, a seventh channel region S70, a thirteenth doped region S71 and a fourteenth doped region S72 located on both sides of the seventh channel region S70. One of the two doped regions located on both sides of each channel region is a source region, and the other is a drain region. The source region and drain region are doped with impurities. The impurities include P-type impurities or N-type impurities. Exemplarily, the active layer S includes any one or more of low-temperature polysilicon, amorphous silicon, and oxide active layer.

Figure 7:
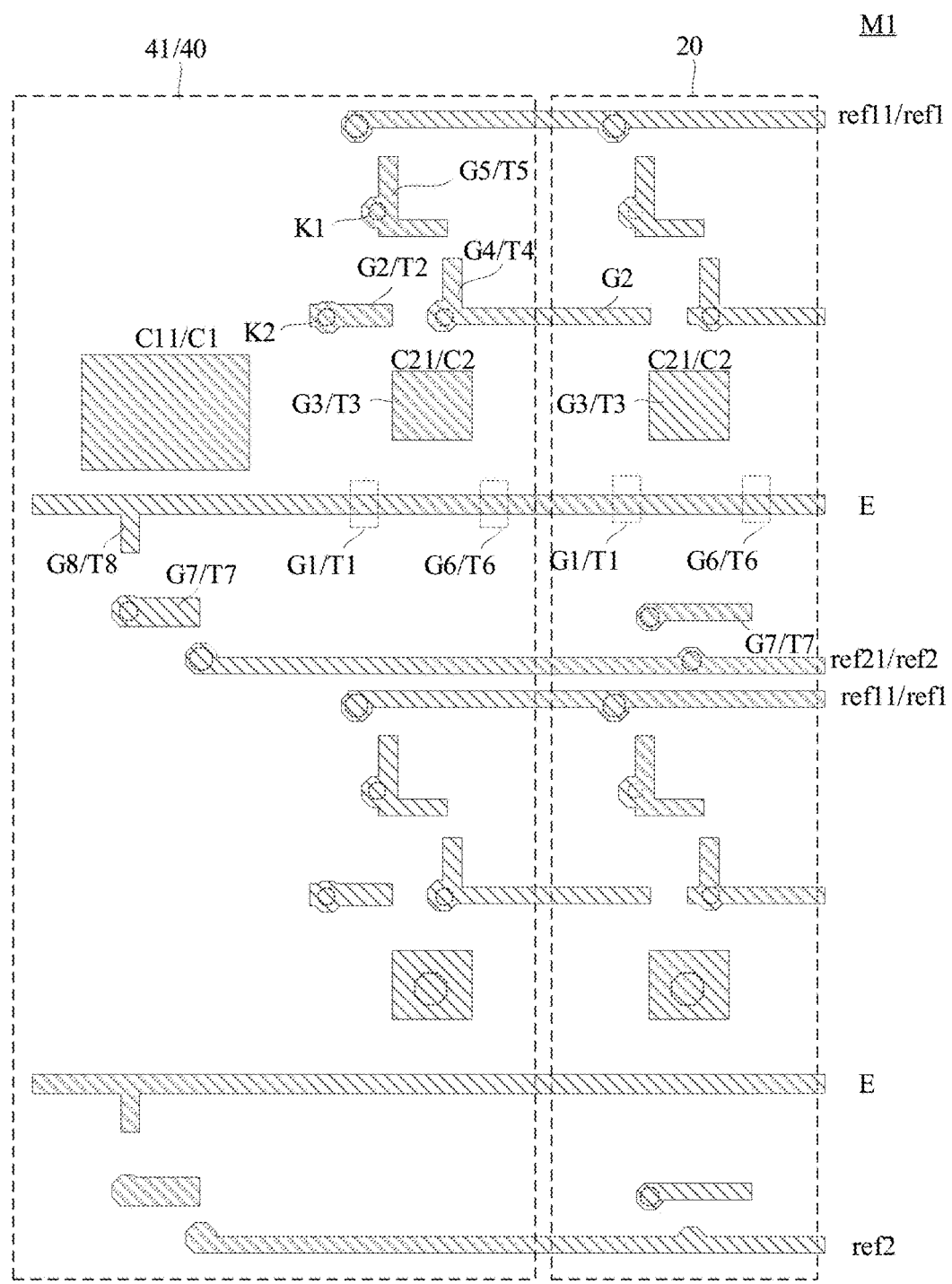
FIG. 7 is a top-view schematic diagram of a first conductor layer provided by an embodiment of the present disclosure.
Figure 7:
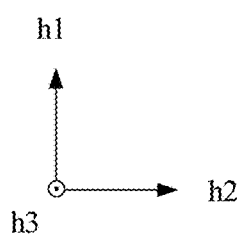
Figure 10:
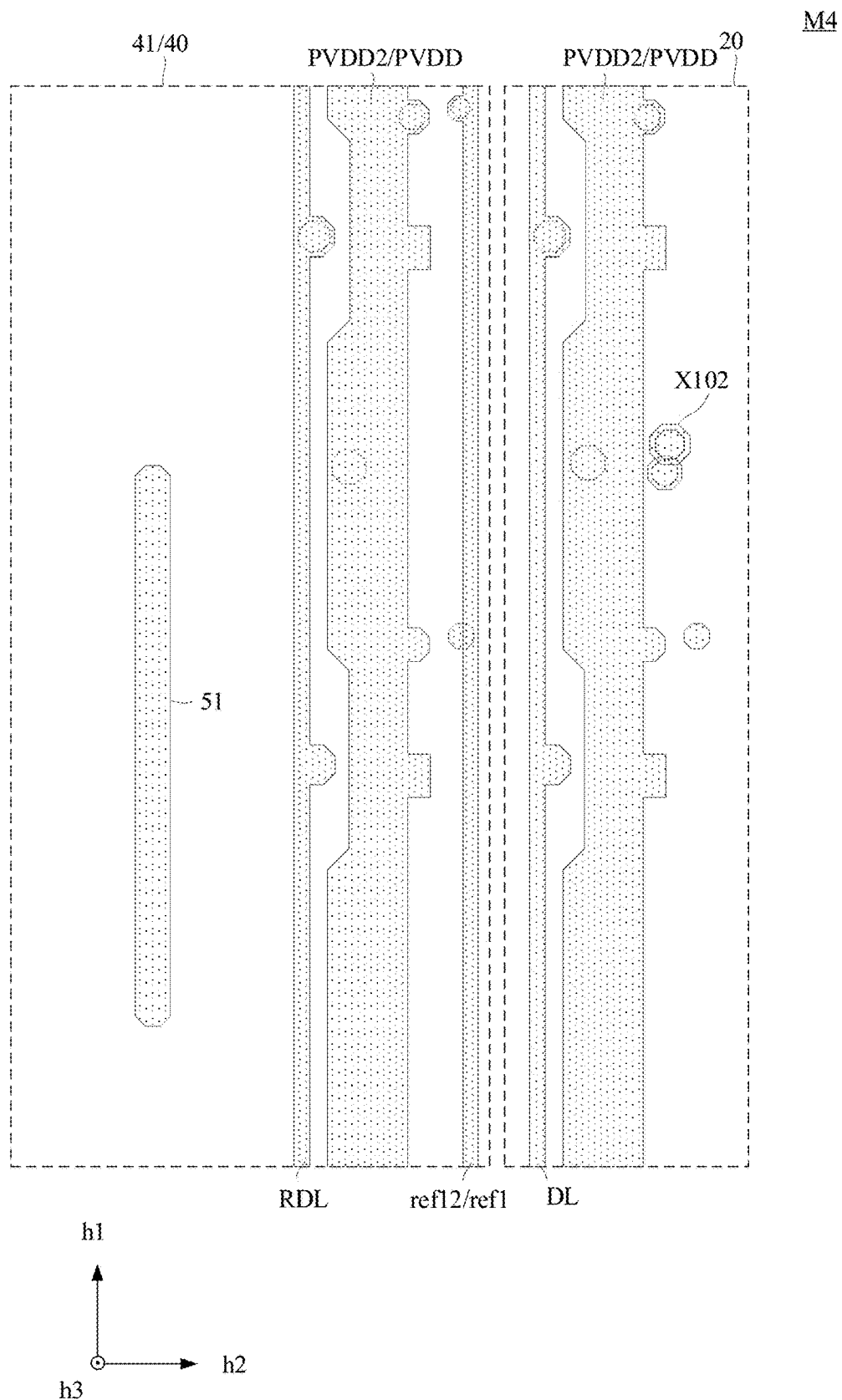
FIG. 10 is a top-view schematic diagram of a fourth conductor layer provided by an embodiment of the present disclosure.

Exemplarily, as shown in FIGS. 4, 7, and 10, in the embodiments of the present disclosure, it is possible to set the above-mentioned first reset voltage line ref1 to include a first sub-reset voltage line ref11 (not shown in FIG. 10) extending along the second direction h2 and a second sub-reset voltage line ref12 (not shown in FIG. 7) extending along the first direction h1, and to set the above-mentioned second reset voltage line ref2 to include a third sub-reset voltage line ref21 extending along the second direction h2 and a fourth sub-reset voltage line (not shown) extending along the first direction h1. The first sub-reset voltage line ref11 and the second sub-reset voltage line ref12 are electrically connected, and the third sub-reset voltage line ref21 and the fourth sub-reset voltage line are electrically connected.

Optionally, as shown in FIGS. 4, 7, and 10, in the embodiments of the present disclosure, it is possible to set the above-mentioned first power supply voltage line PVDD to include a first sub-power supply voltage line PVDD1 (not shown in FIG. 10) extending along the second direction h2 and a second sub-power supply voltage line PVDD2 (not shown in FIG. 7) extending along the first direction h1. The first sub-power supply voltage line PVDD1 and the second sub-power supply voltage line PVDD2 are electrically connected.

As shown in conjunction with FIGS. 4 and 7, FIG. 7 is a top-view schematic diagram of a first conductor layer provided by an embodiment of the present disclosure. The first conductor layer M1 includes the above-mentioned light emission control line E, the first sub-reset voltage line ref11, the third sub-reset voltage line ref21, a first plate C11 of the first capacitor C1, the first plate C21 of the second capacitor C2, the gate G2 of the data writing transistor T2, the gate G4 of the threshold compensation transistor T4, the gate G5 of the first reset transistor T5, and the gate G7 of the second reset transistor T7. Exemplarily, as shown in FIG. 7, the gate G2 of the data writing transistor T2 and the gate G4 of the threshold compensation transistor T4 may be electrically connected.

As shown in conjunction with FIGS. 4 and 7, along the direction h3 perpendicular to the plane where the substrate 1 is located, the gate G2 of the data writing transistor T2 at least partially overlaps with the above-mentioned second channel region S20, the gate G4 of the threshold compensation transistor T4 at least partially overlaps with the above-mentioned fourth channel region S40, the gate G5 of the first reset transistor T5 at least partially overlaps with the above-mentioned fifth channel region S50, and the gate G7 of the second reset transistor T7 overlaps with the seventh channel region S70.

As shown in conjunction with FIGS. 4 and 7, along the direction h3 perpendicular to the plane where the substrate 1 is located, the portions of the light emission control line E overlapping with the above-mentioned first channel region S10 and sixth channel region S60 correspondingly form the gate G1 of the first light emission control transistor T1 and the gate G6 of the second light emission control transistor T6, respectively. The portion of the first plate C21 of the second capacitor C2 overlapping with the above-mentioned third channel region S30 correspondingly forms the gate G3 of the drive transistor T3.

Exemplarily, as shown in FIGS. 2A, 2B, and 4, the above-mentioned threshold compensation transistor T4 and first reset transistor T5 may adopt a double-gate structure including two gates to reduce a leakage current at the first node N1 in each of the repair driving circuit 40 and the pixel driving circuit 20, and the first nodes N1 is electrically connected to the gate of the drive transistor T3, which is conducive to improving the stability of the driving current provided to the light-emitting element 3 and reducing the possibility of flickering of the light-emitting element 3 during display.

Optionally, the first conductor layer M1 may include any one of such as molybdenum (Mo), copper (Cu), aluminum (Al), and titanium (Ti) or an alloy of more thereof.

Figure 8:
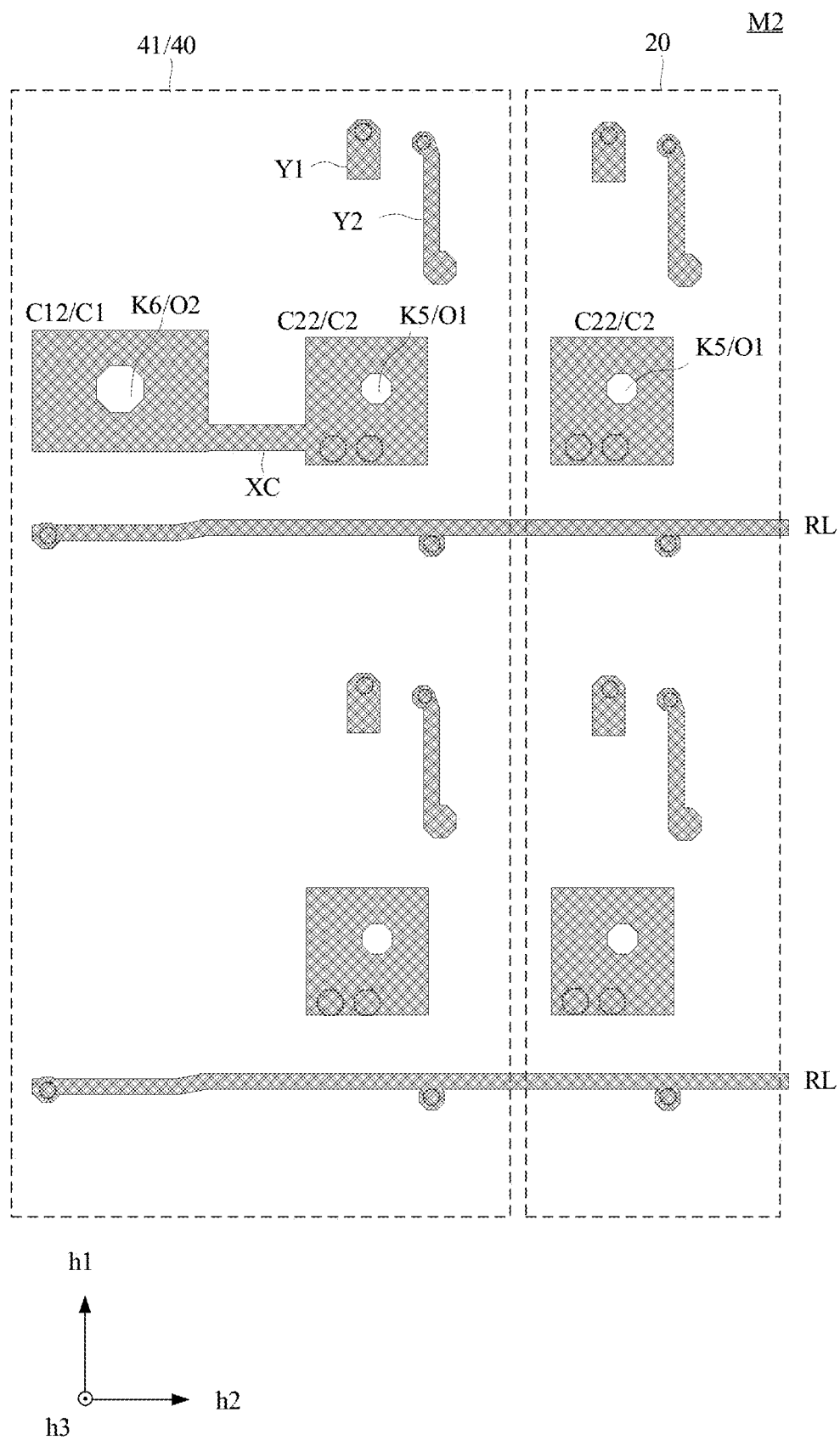
FIG. 8 is a top-view schematic diagram of a second conductor layer provided by an embodiment of the present disclosure.

As shown in conjunction with FIGS. 4 and 8, FIG. 8 is a top-view schematic diagram of a second conductor layer provided by an embodiment of the present disclosure. The second conductor layer M2 includes a second plate C12 of the first capacitor C1, the second plate C22 of the second capacitor C2, and the above-mentioned repair line RL.

Exemplarily, the second conductor layer M2 may include any one of such as molybdenum (Mo), copper (Cu), aluminum (Al), and titanium (Ti) or an alloy of more thereof.

As shown in FIGS. 4 and 8, the second conductor layer M2 further includes a capacitor connection portion XC, which is configured to electrically connect the second plate C12 of the first capacitor C1 and the second plate C22 of the second capacitor C2.

Figure 9:
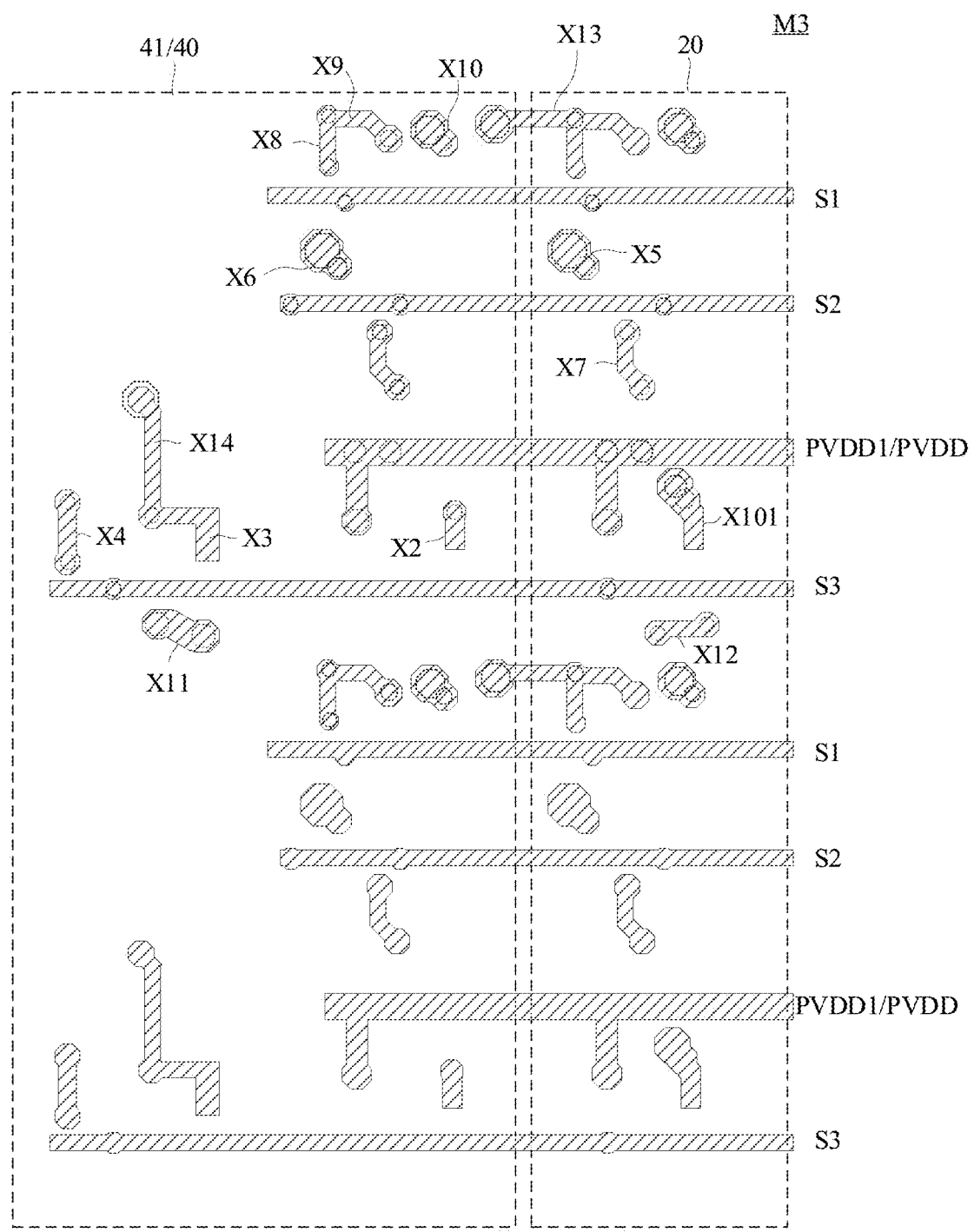
FIG. 9 is a top-view schematic diagram of a third conductor layer provided by an embodiment of the present disclosure.

As shown in conjunction with FIGS. 4 and 9, FIG. 9 is a top-view schematic diagram of a third conductor layer provided by an embodiment of the present disclosure. The third conductor layer M3 includes the first scan line S1, the second scan line S2, the third scan line S3, and the first sub-power supply voltage line PVDD1.

As shown in conjunction with FIGS. 4 and 9, along the direction h3 perpendicular to the plane where the substrate 1 is located, the first scan line S1 at least partially overlaps with the gate G5 of the above-mentioned first reset transistor T5. Exemplarily, the first scan line S1 is electrically connected to the gate G5 of the first reset transistor T5 located in the first conductor layer M1 through a via hole penetrating the third insulating layer and the second insulating layer.

Along the direction h3 perpendicular to the plane where the substrate 1 is located, the second scan line S2 at least partially overlaps with the gate G4 of the above-mentioned threshold compensation transistor T4, and the second scan line S2 at least partially overlaps with the gate G2 of the above-mentioned data writing transistor T2. Exemplarily, the second scan line S2 is electrically connected to the gate G2 of the data writing transistor T2 and the gate G4 of the threshold compensation transistor T4 located in the first conductor layer M1 through a via hole penetrating the third insulating layer and the second insulating layer.

Along the direction h3 perpendicular to the plane where the substrate 1 is located, the third scan line S3 at least partially overlaps with the gate G7 of the above-mentioned second reset transistor T7. Exemplarily, the third scan line S3 is electrically connected to the gate G7 of the second reset transistor T7 located in the first conductor layer M1 through a third via hole K3 penetrating the third insulating layer and the second insulating layer.

Optionally, the third conductor layer M3 may include any one of such as molybdenum (Mo), copper (Cu), aluminum (Al), and titanium (Ti) or an alloy of more thereof. Exemplarily, the third conductor layer M3 may be provided as a three-layer structure. For example, the third conductor layer M3 includes a three-layer structure composed of Ti—Al—Ti. Based on this arrangement, it is possible to reduce the resistance of the above-mentioned first scan line S1, the second scan line S2, the third scan line S3, and the first sub-power supply voltage line PVDD1 provided in the third conductor layer M3, thereby reducing the voltage drop of the signals transmitted by the above-mentioned lines during transmission.

As shown in FIGS. 2A, 2B, and 10, FIG. 10 is a top-view schematic diagram of a fourth conductor layer provided by an embodiment of the present disclosure. The fourth conductor layer M4 includes the pixel data line DL, the repair data line RDL, the second sub-reset voltage line ref12, and the second sub-power supply voltage line PVDD2. It should be noted that the above-mentioned fourth sub-reset voltage line may also be provided in the fourth conductor layer. The second sub-reset voltage line and the fourth sub-reset voltage line may be alternately arranged in the second direction h2.

Optionally, the fourth conductor layer M4 may include any one of such as molybdenum (Mo), copper (Cu), aluminum (Al), and titanium (Ti) or an alloy of more thereof. Exemplarily, the fourth conductor layer M4 may be provided as a three-layer structure. For example, the fourth conductor layer M4 includes a three-layer structure comprised of Ti—Al—Ti. Based on this arrangement, it is possible to reduce the resistance of the above-mentioned pixel data line DL, the repair data line RDL, the second sub-reset voltage line ref12, and the second sub-power supply voltage line PVDD2 provided in the fourth conductor layer M4, thereby reducing the voltage drop of the signals transmitted by the above-mentioned lines during transmission.

Exemplarily, the thickness of at least one of the third conductor layer M3 and the fourth conductor layer M4 is greater than the thickness of the first conductor layer M1; and the thickness of at least one of the third conductor layer M3 and the fourth conductor layer M4 is greater than the thickness of the second conductor layer M2. And, the resistivity of at least one of the third conductor layer M3 and the fourth conductor layer M4 is less than the resistivity of the first conductor layer M1; and the resistivity of at least one of the third conductor layer M3 and the fourth conductor layer M4 is less than the resistivity of the second conductor layer M2.

Optionally, the thickness of the first conductor layer M1 and the thickness of the second conductor layer M2 may be equal, and the thickness of the third conductor layer M3 and the thickness of the fourth conductor layer M4 may be equal.

As shown in conjunction with FIGS. 4, 5, and 9, the display panel 100 further includes first transfer connection structures X101 located in the third conductor layer M3. When the pixel driving circuit 20 is normal, the first transfer connection structure X101 is configured to electrically connect the anode 31 of the light-emitting element 3 and the second light emission control transistor T6 of the pixel driving circuit 20. When the pixel driving circuit 20 is abnormal and the repair driving circuit 40 is utilized to participate in pixel repair, the first transfer connection structure X101 is configured to electrically connect the anode 31 of the light-emitting element 3 and the repair line RL.

Exemplarily, as shown in FIG. 5, the first transfer connection structure X101 is electrically connected to the twelfth doped region S62 of the second light emission control transistor T6 of the pixel driving circuit 20 through a via hole K1 penetrating the third insulating layer 103, the second insulating layer 102 and the first insulating layer 101.

As shown in conjunction with FIGS. 4 and 5, the first transfer connection structure X101 also at least partially overlaps with the repair line RL along the direction h3 perpendicular to the plane where the substrate 1 is located, forming a first parasitic capacitance Q1 as shown in FIG. 2A.

In the embodiments of the present disclosure, one pixel driving circuit row 2 includes a plurality of pixel driving circuits 20 arranged along the second direction h2. As shown in FIG. 2A, a first parasitic capacitance Q1_1 is formed at the overlap between the repair line RL corresponding to the pixel driving circuits 20 and the first transfer connection structure (not shown in FIG. 2A) in one pixel driving circuit 20 in the pixel driving circuit row 2, and a first parasitic capacitance Q1_2 is formed at the overlap between the repair line RL and the first transfer connection structure (not shown in FIG. 2A) in another pixel driving circuit 20_2 in the above-mentioned same pixel driving circuit row 2. For simplicity of the figure, the detailed structure within the pixel driving circuit 20_2 is omitted in FIG. 2A. And, in an actual display panel, one repair line RL usually forms a plurality of the first parasitic capacitances Q1_2 with the plurality of pixel driving circuits 202 in the above-mentioned same pixel driving circuit row 2.

Figure 11:
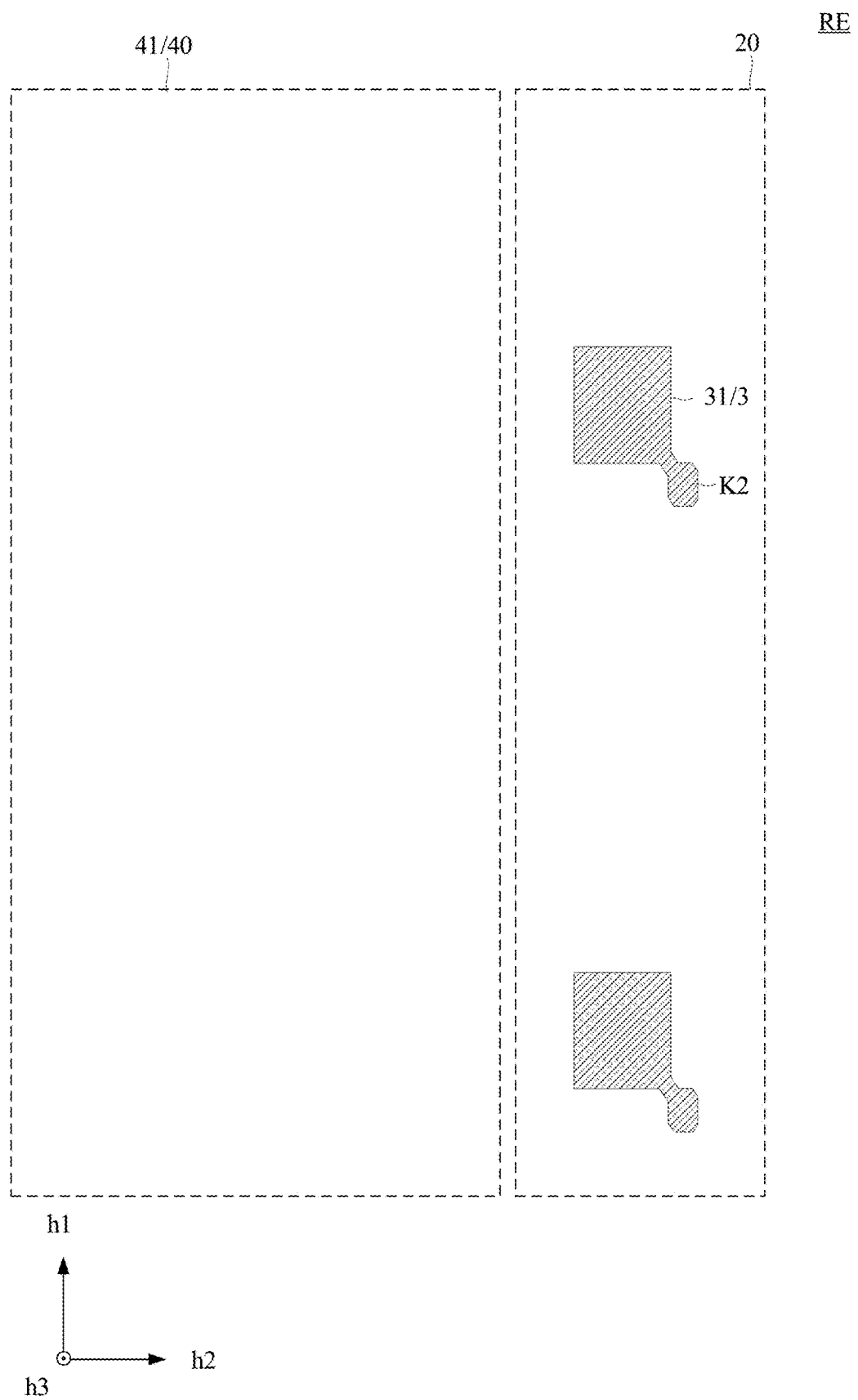
FIG. 11 is a top-view schematic diagram of a fifth conductor layer provided by an embodiment of the present disclosure.

As shown in conjunction with FIGS. 4, 5, and 11, FIG. 11 is a top-view schematic diagram of a fifth conductor layer provided by an embodiment of the present disclosure. The display panel 100 further includes the fifth conductor layer M5 located on a side of the fifth insulating layer 105 away from the substrate 1. The fifth conductor layer M5 includes the anode 31 of the light-emitting element 3.

As shown in FIGS. 4, 5, and 10, the fourth conductor layer M4 includes an electrode connection portion X102. When a pixel driving circuit 20 is normal, the above-mentioned first transfer connection structure X101 is electrically connected to the anode 31 through the electrode connection portion X102.

As shown in FIG. 5, the anode 31 of the light-emitting element 3 is electrically connected to the electrode connection portion X102 through a via hole K2 penetrating the fifth insulating layer 105. The electrode connection portion X102 is further electrically connected to the first transfer connection structure X101 through the via hole K3 penetrating the fourth insulating layer 104.

As mentioned above, in the embodiments of the present disclosure, the repair line RL at least partially overlaps with the repair driving circuit 40. Specifically, as shown in conjunction with FIGS. 4, 5, and 9, the repair driving circuit 40 includes a second transfer connection structure X2 located in the third conductor layer M3. The second transfer connection structure X2 is electrically connected to the second light emission control transistor T6 in the repair driving circuit 40, and along the direction h3 perpendicular to the plane where the substrate 1 is located, the second transfer connection structure X2 at least partially overlaps with the repair line RL. Exemplarily, the second transfer connection structure X2 may be electrically connected to the twelfth doped region S62 of the second light emission control transistor T6 in the repair driving circuit 40 through a via hole penetrating the third insulating layer, the second insulating layer, and the first insulating layer.

As shown in FIGS. 4 and 9, the repair driving circuit 40 further includes a third transfer connection structure X3 located in the third conductor layer M3. The third transfer connection structure X3 is electrically connected to the second reset transistor T7 in the repair driving circuit 40, and along the direction h3 perpendicular to the plane where the substrate 1 is located, the third transfer connection structure X3 at least partially overlaps with the repair line RL, forming a second parasitic capacitance Q2 as shown in FIG. 2A.

Exemplarily, the third transfer connection structure X3 may be electrically connected to the fourteenth doped region S72 of the second reset transistor T7 of the repair driving circuit 40 through a via hole penetrating the third insulating layer, the second insulating layer, and the first insulating layer.

Exemplarily, as shown in FIGS. 2A, 2B, and 4, the transistors in the repair circuit 41 further include a repair control transistor T8, which is configured to electrically connect the repair line RL and the second reset transistor T7 in the repair circuit 41.

Exemplarily, as shown in FIGS. 2A, 2B, and 4, a first electrode of the repair control transistor T8 is electrically connected to the second reset transistor T7 in the repair circuit 41, and a connection point between the repair control transistor T8 and the second reset transistor T7 is a first connection point 61. A second electrode of the repair control transistor T8 is electrically connected to the repair line RL.

When the repair circuit 41 does not participate in pixel repair, the emission control line E may control the repair control transistor T8 to be turned off in at least some stages, such that the second reset voltage provided by the second reset voltage line ref2 can be prevented from being repeatedly written into the repair line RL through the second reset transistor T7 of the repair circuit 41, and in turn the repair line RL can be prevented from being repeatedly charged and discharged, which is conducive to reducing power consumption.

Exemplarily, in the embodiment of the present disclosure, it is possible to make a gate of the repair control transistor T8 electrically connected to the emission control line E, to cause, when the repair circuit 41 does not participate in pixel repair, the repair control transistor T8 to be turned off at least during stages other than the emission stage t4, such that the second reset voltage provided by the second reset voltage line ref2 can be prevented from being repeatedly written into the repair line RL through the second reset transistor T7 of the repair circuit 41, and the repair line RL is prevented from being repeatedly charged and discharged.

Figure 6:
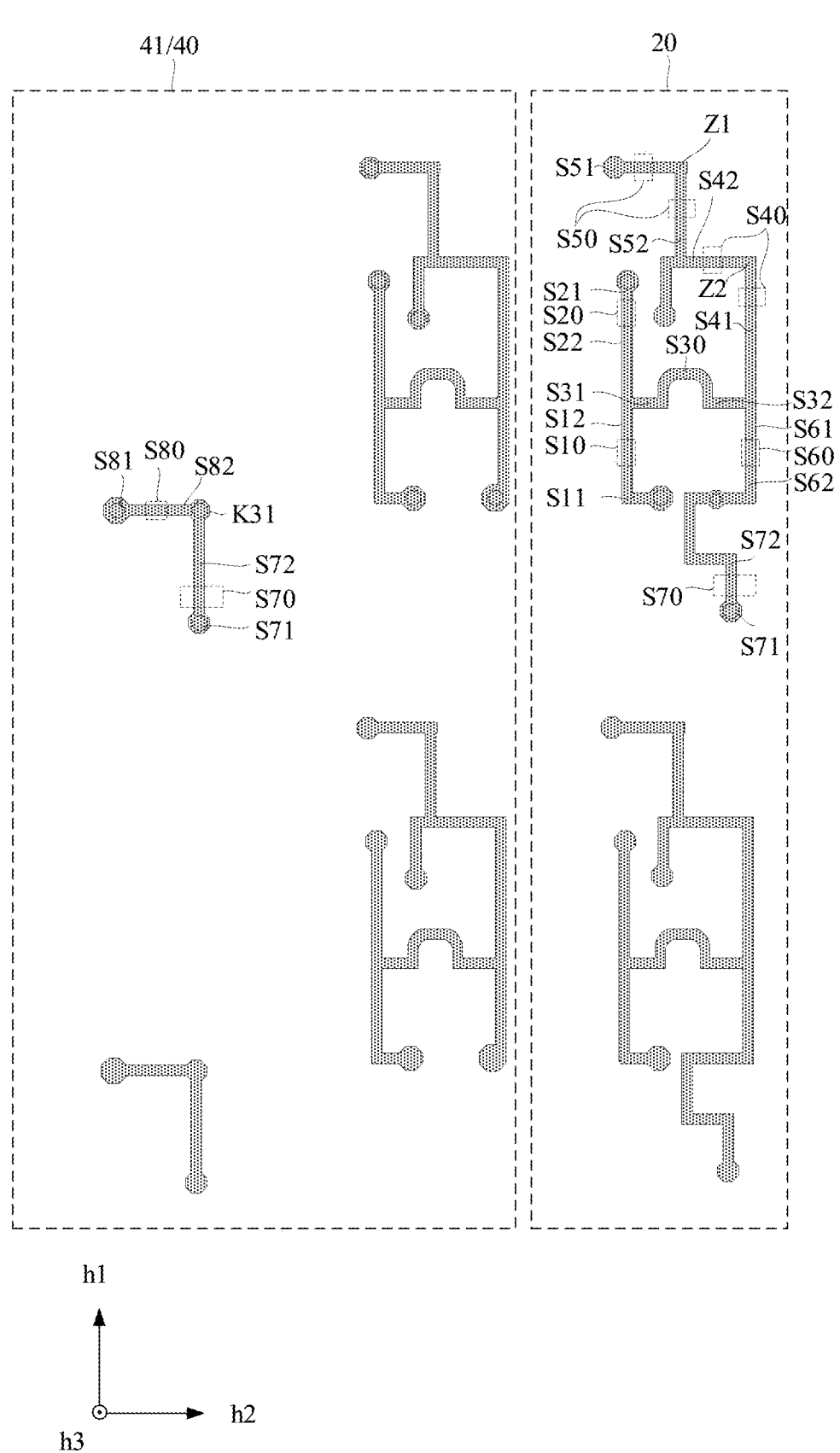
FIG. 6 is a top-view schematic diagram of an active layer provided by an embodiment of the present disclosure.

Exemplarily, as shown in FIG. 6, the above-mentioned active layer S further includes an eighth channel region S80, and a fifteenth doped region S81 and a sixteenth doped region S82 located on both sides of the eighth channel region S80. As shown in conjunction with FIGS. 6 and 7, along the direction h3 perpendicular to the plane where the substrate 1 is located, the overlap part between the emission control line E and the eighth channel region S80 correspondingly forms the gate G8 of the repair control transistor T8.

Exemplarily, as shown in FIG. 4, the third transfer connection structure X3 is electrically connected to the above-mentioned first connection point 61, and along the direction h3 perpendicular to the plane where the substrate 1 is located, the third transfer connection structure X3 at least partially overlaps with the repair line RL. Exemplarily, as shown in conjunction with FIG. 6, the third transfer connection structure X3 is electrically connected to the above-mentioned sixteenth doped region S82.

Exemplarily, as shown in FIGS. 4 and 9, the repair driving circuit 40 further includes a fourth transfer connection structure X4 located in the third conductor layer M3. The fourth transfer connection structure X4 is electrically connected to the fifteenth doped region S81 of the repair control transistor T8, and along the direction h3 perpendicular to the plane where the substrate 1 is located, the fourth transfer connection structure X4 at least partially overlaps with the repair line RL. Optionally, the fourth transfer connection structure X4 may be electrically connected to the fifteenth doped region S81 of the repair control transistor T8 through a via hole penetrating the third insulating layer, the second insulating layer, and the first insulating layer.

When the repair circuit 41 is utilized to participate in repair, the third transfer connection structure X3 and the repair line RL may be fused at the overlapping position therebetween, and the fourth transfer connection structure X4 and the repair line RL may be fused at the overlapping position therebetween, thereby causing the repair control transistor T8 to be short-circuited.

Optionally, in the embodiments of the present disclosure, it is also possible to make the fourth transfer connection structure X4 electrically connected to the repair line RL through a via hole penetrating the third insulating layer. Based on this arrangement, when the repair driving circuit 40 participates in pixel repair, there is no need to fuse the fifteenth doped region S81 of the repair control transistor T8 and the repair line RL, which is conducive to simplifying the repair process.

Optionally, as shown in FIGS. 4 and 9, the pixel driving circuit 20 further includes a fifth transfer connection structure X5 located in the third conductor layer M3. The fifth transfer connection structure X5 is configured to electrically connect the data line DL and the data writing transistor T2 of the pixel driving circuit 20. Exemplarily, the data line DL may be electrically connected to the fifth transfer connection structure X5 through a via hole penetrating the fourth insulating layer, and the fifth transfer connection structure X5 may be electrically connected to the first doped region S21 of the data writing transistor T2 of the pixel driving circuit 20 through a via hole penetrating the third insulating layer, the second insulating layer, and the first insulating layer.

Exemplarily, as shown in FIGS. 4 and 9, the repair driving circuit 40 further includes a sixth transfer connection structure X6 located in the third conductor layer M3. The sixth transfer connection structure X6 is configured to electrically connect the repair data line RDL and the data writing transistor T2 of the repair driving circuit 40. Exemplarily, the repair data line RDL may be electrically connected to the sixth transfer connection structure X6 through a via hole penetrating the fourth insulating layer, and the sixth transfer connection structure X6 may be electrically connected to the first doped region S21 of the data writing transistor T2 of the repair driving circuit 40 through a via hole penetrating the third insulating layer, the second insulating layer, and the first insulating layer.

Optionally, as shown in FIGS. 4 and 9, the display panel 100 further includes seventh transfer connection structures X7 located in the third conductor layer M3. Each of the seventh transfer connection structures X7 is configured to electrically connect the first plate C21 of the second capacitor C2, the threshold compensation transistor T4 and the first reset transistor T5. Exemplarily, the seventh transfer connection structure X7 may be electrically connected to the second doped region S42 of the threshold compensation transistor T4 and the second doped region S52 of the first reset transistor T5 through a via hole penetrating the third insulating layer, the second insulating layer, and the first insulating layer. Each of the seventh transfer connection structures X7 may also be electrically connected to the first plate C21 of the second capacitor C2 located in the first conductor layer M1 through a via hole K5 penetrating the third insulating layer, the second conductor layer, and the second insulating layer.

As shown in conjunction with FIG. 8, the second plate C22 of the second capacitor C2 located in the second conductor layer M2 includes a first opening O1. Along the direction h3 perpendicular to the plane where the substrate 1 is located, the above-mentioned via hole K5 overlaps with the first opening O1. Exemplarily, the area of the second opening O2 is greater than or equal to the area of the via hole K5, and the orthographic projection of the via hole K5 onto the plane where the substrate 1 is located is located within that of the first opening O1.

Optionally, as shown in FIGS. 4 and 9, the display panel 100 further includes eighth transfer connection structures X8 located in the third conductor layer M3. Each of the eighth transfer connection structures X8 is configured to electrically connect the first sub-reset voltage line ref11 and the first reset transistor T5. Exemplarily, each of the eighth transfer connection structures X8 may be electrically connected to the first doped region S51 of the first reset transistor T5 through a via hole penetrating the third insulating layer, the second insulating layer, and the first insulating layer, and each of the eighth transfer connection structures X8 may be electrically connected to the first sub-reset voltage line ref11 located in the first conductor layer M1 through a via hole penetrating the third insulating layer and the second insulating layer.

Exemplarily, as shown in FIGS. 4 and 8, the second conductor layer M2 further includes a first overlapping portion Y1 and a second overlapping portion Y2. Along the direction h3 perpendicular to the plane where the substrate 1 is located, the first overlapping portion Y1 overlaps with a first intermediate node Z1 of the first reset transistor T5 using a dual-gate structure, and the second overlapping portion Y2 overlaps with a second intermediate node Z2 of the threshold compensation transistor T4 using a dual-gate structure. As shown in conjunction with FIGS. 2 and 6, the first intermediate node Z1 is located between two fifth channel regions S50 of the first reset transistor T5, and the second intermediate node Z2 is located between two fourth channel regions S40 of the threshold compensation transistor T4. The first overlapping portion Y1 and the second overlapping portion Y2 may be configured to receive fixed signals. The first overlapping portion Y1 may overlap with the first intermediate node Z1 to form a coupling capacitance, to stabilize the potential of the first intermediate node Z1, and the second overlapping portion Y2 may overlap with the second intermediate node Z2 to form a coupling capacitance, to stabilize the potential of the second intermediate node Z2, thereby reducing leakage current at the first node N1 in each of the repair driving circuit 40 and the pixel driving circuit 20. Exemplarily, the first overlapping portion Y1 may be electrically connected to the above-mentioned first reset voltage line ref1 to receive the first reset voltage, and the second overlapping portion Y2 may be electrically connected to the above-mentioned first power supply voltage line PVDD to receive the first power supply voltage.

Optionally, as shown in FIGS. 4 and 9, the display panel 100 further includes ninth transfer connection structures X9 and tenth transfer connection structures X10 located in the third conductor layer M3.

Each of the ninth transfer connection structures X9 is configured to electrically connect the first sub-reset voltage line ref11 and the first overlapping portion Y1. Optionally, each of the ninth transfer connection structures X9 may be electrically connected to the first sub-reset voltage line ref11 through a via hole penetrating the third insulating layer and the second insulating layer, and electrically connected to the first overlapping portion Y1 through a via hole penetrating the third insulating layer. Exemplarily, as shown in FIG. 9, in the embodiment of the present disclosure, it is possible to make the ninth transfer connection structure X9 and the eighth transfer connection structure X8 electrically connected.

Each of the tenth transfer connection structures X10 is configured to electrically connect the second sub-power supply voltage line PVDD2 and the second overlapping portion Y2. Optionally, each of the tenth transfer connection structures X10 may be electrically connected to the second sub-power supply voltage line PVDD2 through a via hole penetrating the fourth insulating layer, and electrically connected to the above-mentioned second overlapping portion Y2 through a via hole penetrating the third insulating layer.

As shown in FIGS. 4 and 9, the repair driving circuit 40 further includes an eleventh transfer connection structure X11 located in the third conductor layer M3. The eleventh transfer connection structure X11 is configured to electrically connect the second reset voltage line ref2 and the second reset transistor T7 in the repair driving circuit 40. Exemplarily, the eleventh transfer connection structure X11 may be electrically connected to the second reset voltage line ref2 through a via hole penetrating the third insulating layer and the second insulating layer, and electrically connected to the first doped region S71 of the second reset transistor T7 located in the repair driving circuit 40 through a via hole penetrating the third insulating layer, the second insulating layer, and the first insulating layer.

As shown in FIGS. 4 and 9, the pixel driving circuit 20 further includes a twelfth transfer connection structure X12 located in the third conductor layer M3. The twelfth transfer connection structure X12 is configured to electrically connect the second reset voltage line ref2 and the second reset transistor T7 in the pixel driving circuit 20. Exemplarily, the twelfth transfer connection structure X12 may be electrically connected to the second reset voltage line ref2 through a via hole penetrating the third insulating layer and the second insulating layer, and electrically connected to the first doped region S71 of the second reset transistor T7 in the pixel driving circuit 20 through a via hole penetrating the third insulating layer, the second insulating layer, and the first insulating layer.

As shown in FIGS. 4 and 9, the display panel 100 further includes thirteenth transfer connection structures X13 located in the third conductor layer M3. Each of the thirteenth transfer connection structures X13 is configured to electrically connect the second sub-reset voltage line ref12 and the first sub-reset voltage line ref11. Exemplarily, the second sub-reset voltage line ref12 may be electrically connected to one end of one of the thirteenth transfer connection structures X13 through a via hole penetrating the fourth insulating layer, and each of the thirteenth transfer connection structures X13 may be electrically connected to the first sub-reset voltage line ref11 through a via hole penetrating the third insulating layer and the second insulating layer.

When the display panel 100 is being detected and it is judged that some pixel driving circuit 20 is abnormal such that the light-emitting element 3 corresponding to the pixel driving circuit 20 cannot emit light normally, in the embodiments of the present disclosure, the repair driving circuit 40 may be utilized to supply power to the corresponding light-emitting element 3, thereby repairing a pixel.

Exemplarily, in the embodiments of the present disclosure, the electrical connection between the abnormal pixel driving circuit 20 and the light-emitting element 3 may be disconnected. Specifically, as shown in FIG. 2B, in the embodiments of the present disclosure, the electrical connection between the light-emitting element 3 and the second light emission control transistor T6 in the pixel driving circuit 20 may be disconnected at a first disconnection point F1 or a second disconnection point F2 as shown in FIG. 2B. Exemplarily, the electrical disconnection between two components in the display panel 100 may be implemented through laser fusing.

Optionally, as shown in conjunction with FIGS. 2A, 2B, and 4, at the overlapping position between the repair line RL and the above-mentioned first transfer connection structure X101 (not shown in FIGS. 2A and 2B), i.e., the position of the first parasitic capacitance Q1 as illustrated in FIG. 2A, in the embodiments of the present disclosure, the repair line RL and the above-mentioned first transfer connection structure X101 can be fused. Specifically, when the pixel driving circuit 201 is abnormal, the fusing occurs at the position of the first parasitic capacitance Q1_1. When the pixel driving circuit 20_2 is abnormal, the fusing occurs at the position of the first parasitic capacitance Q1_2.

As shown in FIG. 4, since the first transfer connection structure X101 is electrically connected to the anode 31 of the light-emitting element 3, the repair line RL can be electrically connected to the anode 31 of the light-emitting element 3 through the first transfer connection structure X101. Optionally, the above-mentioned fusing operation includes laser fusing.

Optionally, in the embodiments of the present disclosure, it is also possible to electrically connect the repair driving circuit 40 and the repair line RL. Specifically, in the embodiments of the present disclosure, it is possible to fuse the above-mentioned second transfer connection structure X2 and the repair line RL at the overlapping position therebetween and to fuse the third transfer connection structure X3 and the repair line RL at the overlapping position therebetween. Exemplarily, as shown in FIG. 4, in the embodiments of the present disclosure, it is also possible to electrically connect the second transfer connection structure X2 and the repair line RL. In this case, when the repair driving circuit 40 participates in pixel repair, it is not necessary to perform fusing at the overlapping position between the second transfer connection structure X2 and the repair line RL, and it is only necessary to fuse the third transfer connection structure X3 and the repair line RL at the overlapping position therebetween, i.e., at the second parasitic capacitance Q2 as illustrated in FIG. 2A, to achieve the electrical connection of the second reset transistor T7 and the first capacitor C1 in the repair driving circuit 40 to the repair line RL.

When the repair driving circuit 40 participates in the repair process, as shown in conjunction with FIGS. 2B and 3, the operation process of the repair driving circuit 40 includes a first reset phase t1, a charging phase t2, a second reset phase t3, and a light-emitting phase t4. In the first reset phase t1, the first scan line S1 controls the first reset transistor T5 to be turned on, and a first reset voltage provided by the first reset voltage line ref1 resets the first node N1 through the first reset transistor T5. In the charging phase t2, the second scan line S2 controls the data writing transistor T2 and the threshold compensation transistor T4 to be turned on, and the data voltage provided by the repair data line RDL is written into the second node N2 through the data writing transistor T2 of the repair driving circuit 40. In this phase, the drive transistor T3 is turned on. The potential of the first node N1 changes continuously until the potential of the first node N1 changes to $V_{N1}$=Vdata−|Vth|, which is maintained by the second capacitor C2. Vdata is the data voltage provided by the repair data line RDL, and Vth is the threshold voltage of the drive transistor T3. In the second reset phase t3, the third scan line S3 controls the second reset transistor T7 to be turned on, and the second reset voltage provided by the second reset voltage line ref2 resets the fourth node N4 through the second reset transistor T7. In the light-emitting phase t4, the first light emission control transistor T1, the second light emission control transistor T6, and the drive transistor T3 are turned on, the current path between the first power supply voltage line PVDD and the second power supply voltage line PVEE conducts, and the light-emitting element 3 electrically connected to the repair driving circuit 40 is lighted up.

When the repair driving circuit 40 participates in repair, as shown in FIG. 2B, the first capacitor C1 is connected between the first power supply voltage line PVDD and the repair line RL. The first plate of the first capacitor C1 and the repaired light-emitting element 3 are both electrically connected to the repair line RL, such that the load on the repair line RL can be increased, the repaired light-emitting element 3 can be turned on more slowly than other normal light-emitting elements 3, and the occurrence of a bright spot phenomenon in the repaired light-emitting element 3 can be suppressed at the time of low gray scale display.

In the embodiments of the present disclosure, the light-emitting element 3 corresponding to the pixel driving circuit 20 refers to the light-emitting element 3 electrically connected to that pixel driving circuit 20 among a plurality of light-emitting elements 3. The repair line RL corresponding to the pixel driving circuits 20 refers to the repair line RL overlapping with the pixel driving circuits 20 among a plurality of repair lines RL along the direction h3 perpendicular to the plane where the substrate 1 is located. The correspondence between the pixel driving circuits 20 and the repair driving circuit 40 means that both the pixel driving circuits 20 and the repair driving circuit 40 overlap with a same repair line RL along the direction h3 perpendicular to the plane where the substrate 1 is located.

It should be understood that two structures overlapping in a specified direction as mentioned in the embodiments of the present disclosure means that the two structures at least partially overlap in the specified direction, that is, in addition to the completely overlapping portions in the two structures, there may also be portions which are not overlapping.

In the embodiments of the present disclosure, the capacitance of the first capacitor C1 is greater than or equal to a capacitance of the second capacitor C2. When the repair driving circuit 40 participates in pixel repair, the setting of the first capacitor C1 can cause the repaired light-emitting element 3 to be turned on more slowly than other normal light-emitting elements 3, and the occurrence of a bright spot phenomenon in the repaired light-emitting element 3 can be suppressed at the time of low gray scale display, which is conducive to improving the display effect of the display panel. As shown in FIGS. 2A, 2B, and 4, the first capacitor C1 includes the first plate C11 and the second plate C12. The first plate C11 is electrically connected to the second electrode of the second reset transistor T7 and the second electrode of the repair control transistor T8 in the repair driving circuit 40, and the second plate C12 is electrically connected to a fixed signal terminal. Exemplarily, the fixed signal terminal includes the first power supply voltage line PVDD.

In the embodiments of the present disclosure, the number of first capacitors C1 is N2, where both N1 and N2 are positive integers, and N2<2N1. Exemplarily, the area of the first capacitor C1 may be larger than the area of the second capacitor C2.

In the embodiments of the present disclosure, the repair lines RL and the repair driving circuits 40 are provided within the display panel 100, so that when a pixel driving circuit 20 is abnormal and cannot drive a light-emitting element 3 normally, a repair driving circuit 40 can be utilized to supply power to the light-emitting element 3 that should be driven by the pixel driving circuit 20 through a repair line RL, which can improve the reliability of the display panel 100. Furthermore, in the embodiments of the present disclosure, the first capacitor C1 is provided within each of the repair driving circuits 40, so that when the repair driving circuit 40 participates in pixel repair, the repaired light-emitting element 3 can be lighted up more slowly than other normal light-emitting elements 3, and the occurrence of a bright spot phenomenon in the repaired light-emitting element 3 can be suppressed at the time of low gray scale display, which is conducive to improving the display effect of the display panel 100. In addition, in the embodiments of the present disclosure, by setting N2<2N1, it is possible to reduce the number of first capacitors C1 provided in the display panel 100, which is conducive to minimizing the area occupied by the repair driving circuits 40.

It should be noted that the structures of the pixel driving circuits 20 and the repair driving circuits 40 as shown in FIGS. 2 and 4 are merely illustrative. The structures of the pixel driving circuit 20 or the repair driving circuit 40 may be adjusted according to different design requirements in the embodiments of the present disclosure. For example, the pixel driving circuit 20 may be designed as an 8T1C structure including 8 transistors and 1 storage capacitor or a 2T1C structure including 2 transistors and 1 storage capacitor, which is not limited by the embodiments of the present disclosure. In addition, the types of the various transistors shown in FIG. 2 are also illustrative. For example, the above-mentioned threshold compensation transistor T4 and the first reset transistor T5 may be provided as oxide transistors, which is not limited by the embodiments of the present disclosure.

Furthermore, the above-mentioned first reset voltage received by the first reset transistor T5 and the second reset voltage received by the second reset transistor T7 may be the same or different. When they are different, the first reset voltage line ref1 for transmitting the first reset voltage and the second reset voltage line ref2 for transmitting the second reset voltage may be provided, respectively, in the way as shown in FIG. 4. When they are the same, in the embodiments of the present disclosure, one reset signal line may be provided to be electrically connected to the first reset transistor T5 and the second reset transistor T7, respectively.

Exemplarily, in the embodiments of the present disclosure, n1 repair circuits 41 located on a same side of the pixel driving circuit rows 2 and adjacent along the first direction h1 may be connected to a same first capacitor C1, where n1≥2, and n1 is an integer, to reduce the number of first capacitors C1. By setting N1<2N2, the area occupied by a plurality of first capacitors C1 is reduced. FIGS. 1 and 4 illustrate the case where n1=2, i.e., two repair circuits 41 located on a same side of the pixel driving circuit rows 2 and adjacent are connected to a same first capacitor C1.

Exemplarily, as shown in FIG. 1, in the embodiment of the present disclosure, the repair driving circuits 40 may be arranged in the non-display region NA of the display panel 100, to reduce the impact of the arrangement of the repair driving circuits 40 on the structures in the display region AA. Correspondingly, in the embodiment of the present disclosure, the n1 repair circuits 41 located on a same side of the pixel driving circuit rows 2 and adjacent along the first direction h1 are connected to a same first capacitor C1, to reduce the total area occupied by a plurality of first capacitors C1, and in turn to reduce the area of the non-display region NA and improve the screen-to-body ratio of the display panel 100.

Exemplarily, as shown in FIGS. 4, 7, and 8, the first capacitor C1 includes a first plate C11 and a second plate C12. As shown in FIG. 9, the repair driving circuit 40 further includes a fourteenth transfer connection structure X14 located in the third conductor layer M3, and the first plate C11 of the first capacitor C1 is electrically connected to the second electrode of the second reset transistor T7 in the above-mentioned repair driving circuit 40 through the fourteenth transfer connection structure X14.

Exemplarily, as shown in FIG. 9, the fourteenth transfer connection structure X14 may be electrically connected to the above-mentioned third transfer connection structure X3.

As shown in conjunction with FIGS. 8 and 9, the fourteenth transfer connection structure X14 may be electrically connected to the first plate C11 of the first capacitor C1 through a via hole K6 penetrating the third insulating layer, the second conductor layer, and the second insulating layer.

As shown in FIG. 8, the second plate C12 of the first capacitor C1 includes a second opening O2. Along the direction h3 perpendicular to the plane where the substrate 1 is located, the above-mentioned via hole K6 and the second opening O2 overlap. Exemplarily, the area of the second opening O2 is greater than or equal to the area of the via hole K6, and the orthographic projection of the via hole K6 onto the plane where the substrate 1 is located is located within that of the second opening O2.

Optionally, as shown in FIG. 4, the first plate C11 of the first capacitor C1 is electrically connected to first connection points 61 of the n1 repair circuits 41 located on the same side of the pixel driving circuit rows 2 and adjacent along the first direction h1 through at least one first connection line 51. Each of the first connection points 61 is the connection point between the first reset transistor T7 and the repair control transistor T8 in each of the repair circuits 41. Based on this arrangement, one first capacitor C1 may be electrically connected to the n1 repair circuits 41 through the first connection line 51, which is equivalent that the n1 repair circuits 41 share a same first capacitor C1 through the first connection line 51, thereby reducing the number of first capacitors C1, and in turn reducing the area occupied by the first capacitors C1 in the display panel 100.

Optionally, in the embodiments of the present disclosure, the above-mentioned first connection line 51 may be provided in a same layer as at least one of the data line DL, the repair data line RDL, and the second sub-power supply voltage line PVDD2. FIGS. 4 and 10 illustrate the first connection line 51, the data line DL, the repair data line RDL, and the second sub-power supply voltage line PVDD2 being arranged on a same fourth conductor layer M4. Based on this arrangement, it is possible to use a single patterning process to form the data line DL, the repair data line RDL, the second sub-power supply voltage line PVDD2, and first connection line 51 in a single process, which is conducive to simplifying the manufacturing process of the display panel 100.

Exemplarily, in the embodiments of the present disclosure, it is possible to set n1≤6. The greater the number of pixel driving circuit rows 2, the greater the probability that the total number of abnormal pixel drive circuits 20 will increase. In the embodiments of the present disclosure, by setting n1≤6, it is possible to reduce the number of first capacitors C1 while taking into consideration the probability of abnormal pixel driving circuits 20 occurring in the display panel 100. In the case where the number of abnormal pixel driving circuits 20 is greater, all of the abnormal pixel driving circuits 20 may be allowed to be repaired through the repair driving circuits 40, enabling the light-emitting elements 3 to be driven normally, which is conducive to improving the repair reliability of the display panel 100 and improving the display effect.

Exemplarily, as shown in FIG. 1, one pixel driving circuit row 2 corresponds to one repair circuit 41. The correspondence between the pixel driving circuit row 2 and the repair circuit 41 means that along the direction h3 perpendicular to the plane where the substrate 1 is located, the pixel driving circuit row 2 and the repair circuit 41 overlap with a same repair line RL. When a pixel driving circuit 20 in the pixel driving circuit row 2 is abnormal, the repair circuit 41 corresponding to the pixel driving circuit row 2 may replace the abnormal pixel driving circuit 20.

Along the second direction, the repair circuit 41 corresponding to an ith pixel driving circuit row 2 of the pixel driving circuit rows is located on one side of the pixel driving circuit rows 2; and the repair circuit 41 corresponding to an (i−1)th pixel driving circuit row 2 of the pixel driving circuit rows is located on the other side of the pixel driving circuit rows 2, where i is an integer, and $2 \leq i \leq N1$. That is, the repair circuits 41 corresponding to two adjacent pixel driving circuit rows 2 are alternately located on opposite sides of the pixel driving circuit rows 2 along the second direction h2. Taking the orientation shown in FIG. 1 as an example, in which it is illustrated that the repair circuits 41 corresponding to two adjacent pixel driving circuit rows 2 are alternately located on the left and right sides of the pixel driving circuit rows 2. Based on this arrangement, it is possible to avoid providing too many repair circuits 41 on a same side of the pixel driving circuit rows 2. Taking the orientation shown in FIG. 1 as an example, it is possible to avoid providing too many repair circuits 41 on the left or right side of the pixel driving circuit rows 2, thereby avoiding the width of the non-display region NA of the display panel 100 that is located on a side of the pixel driving circuit rows 2 from being too large along the second direction h2.

Exemplarily, as shown in FIG. 1, in the embodiments of the present disclosure, it is possible to make one pixel driving circuit row 2 corresponding to one repair circuit 41.

Figure 12:
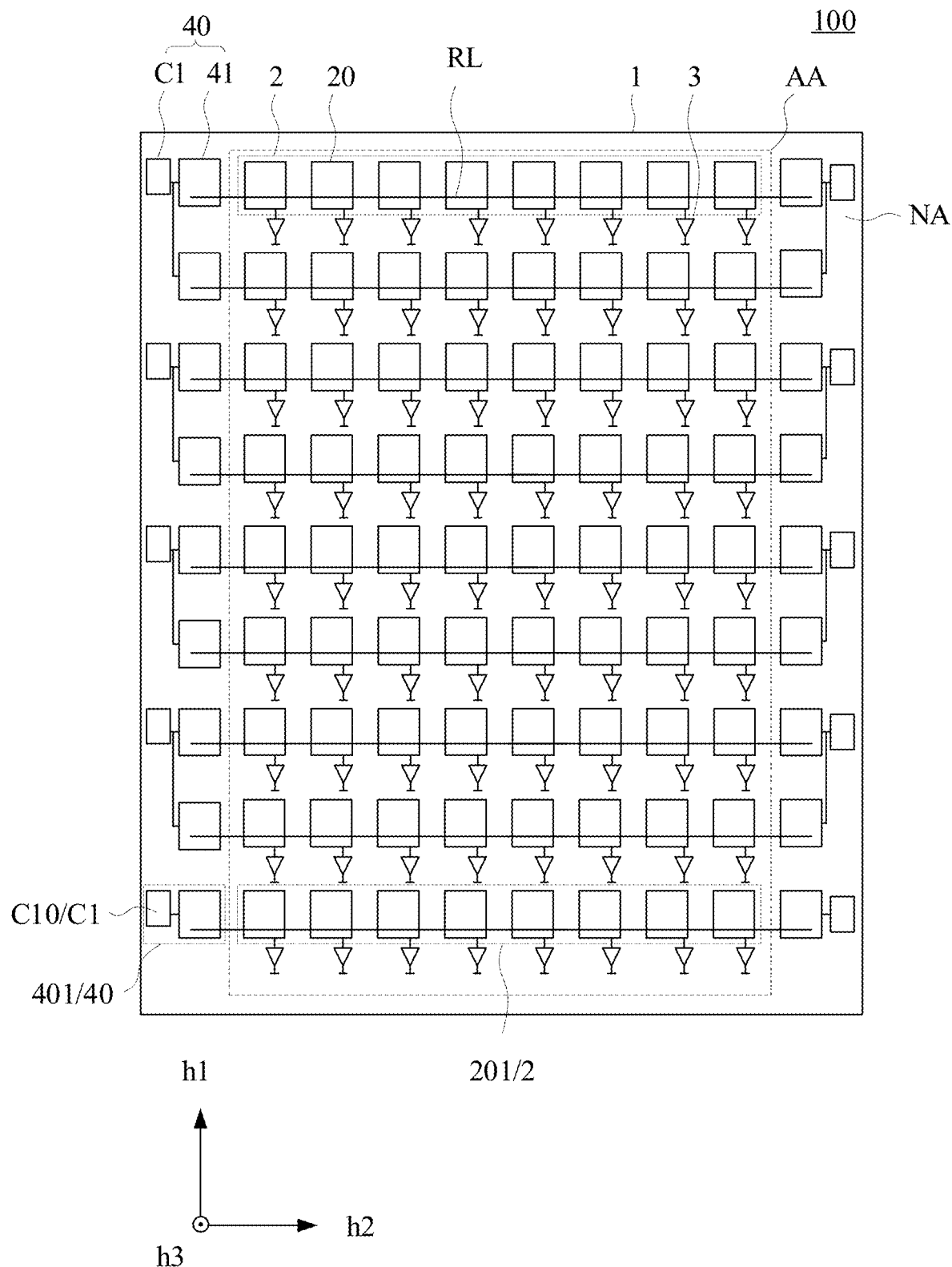
FIG. 12 is a schematic diagram of another display panel provided by an embodiment of the present disclosure.

Or, as shown in FIG. 12, which is a schematic diagram of another display panel provided by an embodiment of the present disclosure, one pixel driving circuit row 2 corresponds to two repair circuits 41. Optionally, as shown in FIG. 12, along the second direction h2, the two repair circuits 41 corresponding to a same pixel driving circuit row 2 are located on both sides of the pixel driving circuit rows 2, respectively.

Based on this arrangement, on the basis of reducing the number of first capacitors C1, when there are two abnormal pixel driving circuits 20 occurring in one pixel driving circuit row 2, one abnormal pixel driving circuit 20 may be electrically connected to the repair circuit 41 located on one side of the pixel driving circuit rows 2 along the second direction h2 through a repair line RL, and the other abnormal pixel driving circuit 20 may be electrically connected to the repair circuit 41 located on the other side of the pixel driving circuit rows 2 along the second direction h2 through the repair line RL, thereby allowing the two abnormal pixel driving circuits 20 to be repaired, which is conducive to improving the repair reliability of the display panel 100. Moreover, in the embodiment of the present disclosure, by providing the two repair circuits 41 on both sides of the pixel driving circuit rows 2 along the second direction h2, the width of the non-display region NA on a same side of the pixel driving circuit rows 2 along the second direction h2 can be avoided from being excessively large.

It should be noted that, as shown in FIGS. 1 and 12, the display panel 100 includes a plurality of first capacitors C1, which include at least a first sub-capacitor C10. The first sub-capacitor C10 is electrically connected to only one repair circuit 41. As shown in FIGS. 1 and 12, the plurality of pixel driving circuit rows 2 include at least a first pixel driving circuit row 201, the plurality of pixel repair circuits 40 include at least a first pixel repair circuit 401, and the first pixel driving circuit row 201 corresponds to the first pixel repair circuit 401. The first pixel repair circuit 401 includes the above-mentioned first sub-capacitor C10 and a repair circuit 41 electrically connected to the first sub-capacitor C10. In other words, the first sub-capacitor C10 in the first pixel repair circuit 401 is only connected to the repair circuit 41 in the first pixel repair circuit 401 and is not electrically connected to the repair circuits 41 in other pixel repair circuits 40.

Exemplarily, as shown in FIGS. 1 and 12, along the first direction h1, the first pixel driving circuit row 201 may be located on a side close to the edge of the display panel 100 in the display region AA. Certainly, the first pixel driving circuit row 201 may also be provided in other positions in the display region AA, which is not limited by the embodiments of the disclosure.

Exemplarily, in the embodiments of the present disclosure, N1 may be set to be an odd number, as illustrated in FIGS. 1 and 12 with N1=9. Or, in the embodiments of the present disclosure, N1 may also be set to be an even number. When N1 is an even number, the above-mentioned first pixel driving circuit row 201 and the first pixel repair circuit 401 may not be provided in the display panel 100. That is, all of the first capacitors C1 in the display panel 100 may be connected to at least two repair circuits 41, without providing the first sub-capacitor C10 that is connected to only one repair circuit 41 in the first capacitor C1.

Figure 13:
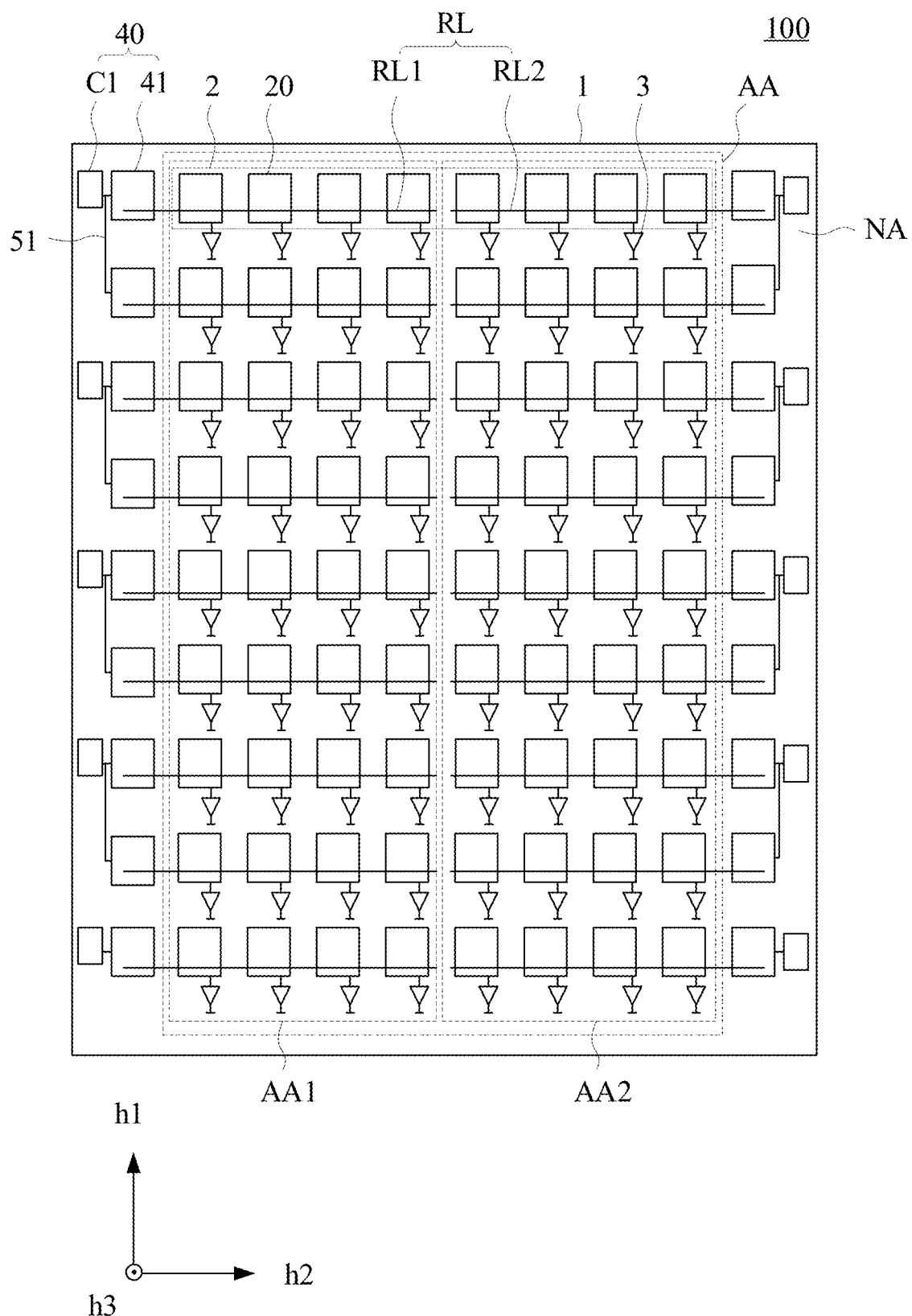
FIG. 13 is a schematic diagram of another display panel provided by an embodiment of the present disclosure.

Exemplarily, as shown in FIG. 13, which is another schematic diagram of a display panel provided by an embodiment of the present disclosure, each of the repair lines RL includes a first repair sub-line RL1 and a second repair sub-line RL2. Along the direction h3 perpendicular to the plane where the substrate 1 is located, one of the two repair circuits 41 corresponding to a same pixel driving circuit row 2 at least partially overlaps with the first repair sub-line RL1, the other one of the two repair circuits 41 at least partially overlaps with the second repair sub-line RL2, and the first repair sub-line RL1 and the second repair sub-line RL2 each overlap with different pixel driving circuits 20 in the same pixel driving circuit row 2.

When there are two abnormal pixel driving circuits 20 occurring in one pixel driving circuit row 2, one abnormal pixel driving circuit 20 may be electrically connected to the repair circuit 41 located on one side of the pixel driving circuit rows 2 in the second direction h2 through the first repair sub-line RL1, and the other abnormal pixel driving circuit 20 may be electrically connected to the repair circuit 41 located on the other side of the pixel driving circuit rows 2 in the second direction h2 through the second repair sub-line RL2, such that when there are two abnormal pixel driving circuits 20 occurring in one pixel driving circuit row 2, the two abnormal pixel driving circuits 20 may be repaired, which is conducive to improving the reliability of the display panel 100.

Exemplarily, as shown in FIG. 13, the display region AA includes a first sub-display region AA1 and a second sub-display region AA2 arranged along the second direction h2. Along the direction h3 perpendicular to the plane where the substrate 1 is located, the first repair sub-line RL1 overlaps with the pixel driving circuits 20 located in the first sub-display region AA1, and the second repair sub-line RL2 overlaps with the pixel driving circuits 20 located in the second sub-display region AA2.

When a pixel driving circuit 20 in the first sub-display region AA1 is abnormal, the first repair sub-line RL1 may electrically connect the light-emitting element 3 corresponding to the abnormal pixel driving circuit 20 and the repair circuit 41 located on the side of the first sub-display region AA1 away from the second sub-display region AA2, in order to employ the repair circuit 41 located on the side of the first sub-display region AA1 away from the second sub-display region AA2 to repair the abnormal pixel driving circuit 20.

When a pixel driving circuit 20 in the second sub-display region AA2 is abnormal, the second repair sub-line RL2 may electrically connect the light-emitting element 3 corresponding to the abnormal pixel driving circuit 20 and the repair circuit 41 located on the side of the second sub-display region AA2 away from the first sub-display region AA1, in order to employ the repair circuit 41 located on the side of the second sub-display region AA2 away from the first sub-display region AA1 to repair the abnormal pixel driving circuit 20.

Figure 14:
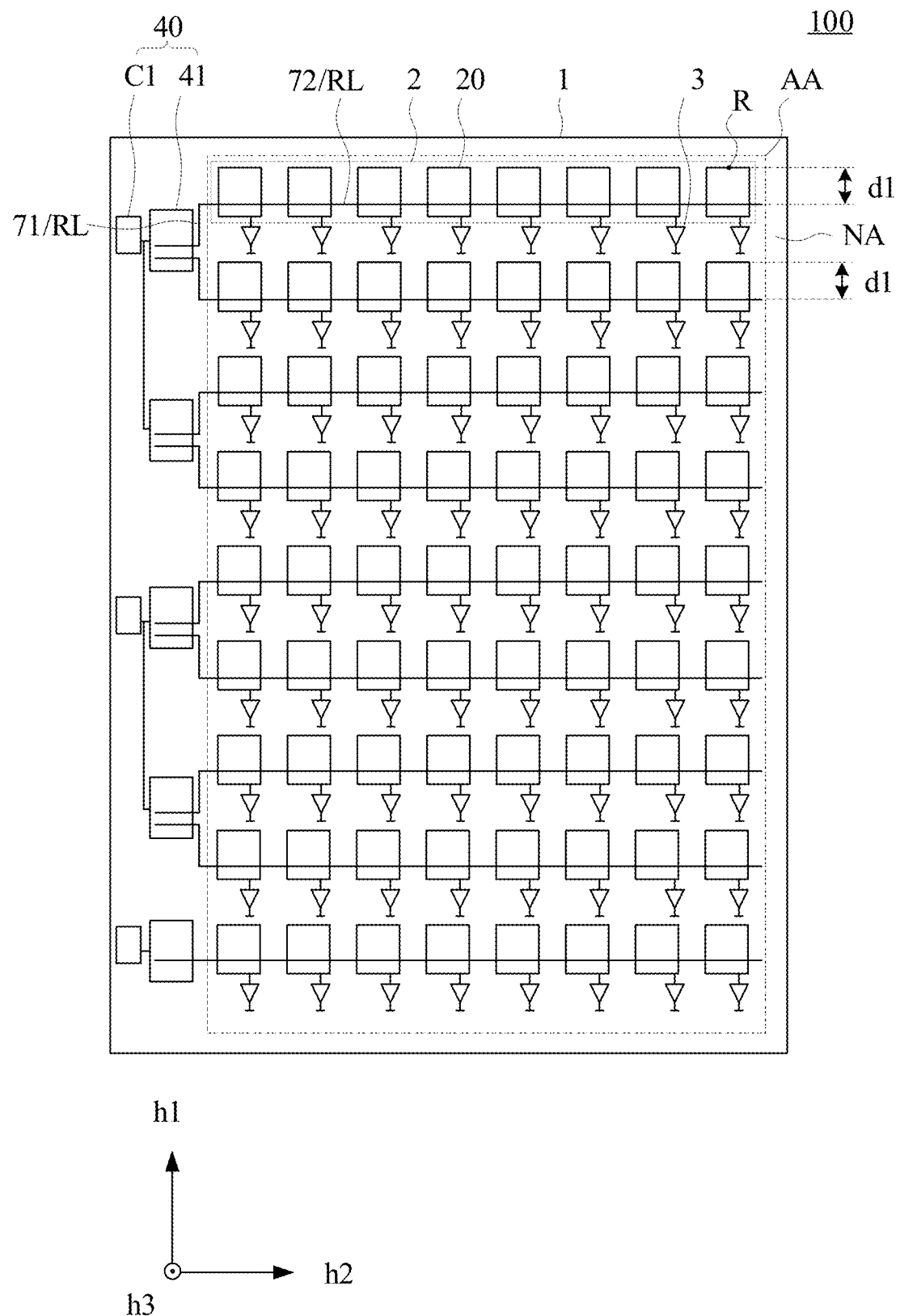
FIG. 14 is a schematic diagram of another display panel provided by an embodiment of the present disclosure.

Exemplarily, in the embodiments of the present disclosure, in order to reduce the number of repair circuits 41, along the direction h3 perpendicular to the plane where the substrate 1 is located, one repair circuit 41 may at least partially overlap with n2 repair lines RL, one repair line RL at least partially overlaps with one pixel driving circuit row 2, where n2≥2, and n2 is an integer, thereby reducing the area occupied by the plurality of repair circuits 41. As shown in FIG. 14, which is another schematic diagram of a display panel provided by an embodiment of the present disclosure, in which n2=2 is taken as an example, i.e., along the direction h3 perpendicular to the plane where the substrate 1 is located, one repair circuit 41 overlaps with two repair lines RL.

By "along the direction h3 perpendicular to the plane where the substrate 1 is located, the repair line RL at least partially overlaps with the pixel driving circuit row 2", it is meant that along the direction h3 perpendicular to the plane where the substrate 1 is located, the repair line RL at least partially overlaps with the above-mentioned first transfer connection structure X101 in the pixel driving circuit row 2. When a pixel driving circuit 20 is abnormal, the repair line RL may be fused with the first transfer connection structure X101 to electrically connect the repair line RL and the anode 31 of the corresponding light-emitting element 3, enabling the driving current provided by a repair driving circuit 40 to be supplied to the corresponding light-emitting element 3 through the repair line RL.

By "along the direction h3 perpendicular to the plane where the substrate 1 is located, the repair circuit 41 at least partially overlaps with the repair line RL", it is meant that along the direction h3 perpendicular to the plane where the substrate 1 is located, the second transfer connection structure X6 in the repair circuit 41 at least partially overlaps with the repair line RL, and the third transfer connection structure X3 in the repair circuit 41 at least partially overlaps with the repair line RL. When the repair circuit 41 participates in repair, the overlapping position between the second transfer connection structure X2 in the repair circuit 41 and the repair line RL may be fused, and the overlapping position between the third transfer connection structure X3 in the repair circuit 41 and the repair line RL may be fused, to electrically connect the second light emission control transistor T6 in the repair circuit 41 and the repair line RL and electrically connect the second reset transistor T6 in the repair circuit 41 and the repair line RL.

Exemplarily, as shown in FIG. 14, the n1 repair circuits 41 located on s same side of the pixel driving circuit rows 2 and adjacent along the first direction h1 are connected to a same first capacitor C1, with FIG. 14 taking n1=2 as an example, to further reduce the number of first capacitors CL.

Figure 15:
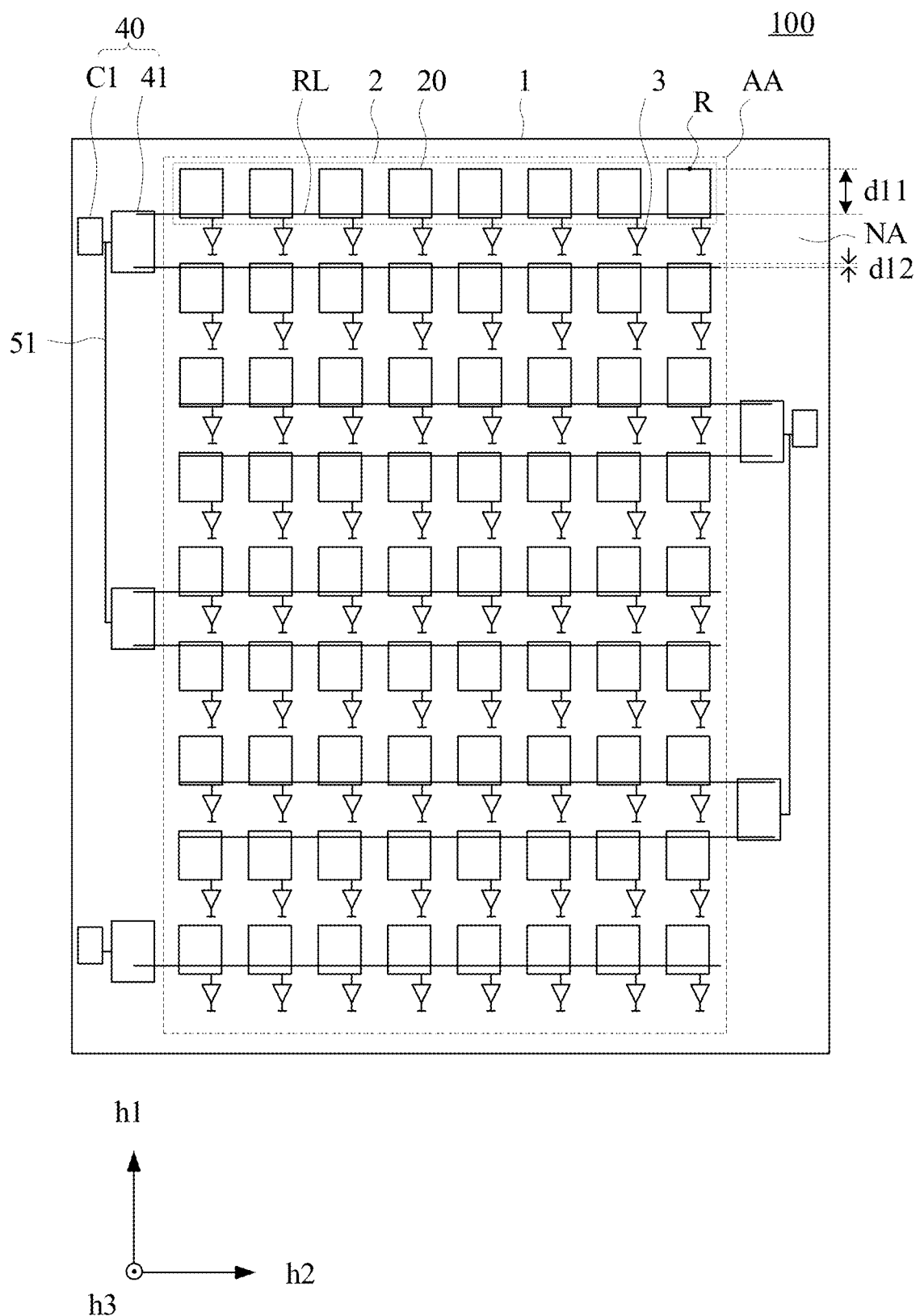
FIG. 15 is a schematic diagram of another display panel provided by an embodiment of the present disclosure.

Optionally, as shown in FIG. 15, which is another schematic diagram of a display panel provided by an embodiment of the present disclosure, in the embodiments of the present disclosure, while one repair circuit 41 at least partially overlaps with the n2 repair lines RL, the repair circuits 41 may are alternately arranged on both sides of the pixel driving circuit rows 2. In the embodiment shown in FIG. 15, n2 is 2. That is, the repair circuits 41 corresponding to two adjacent pixel driving circuit rows 2 are alternately located on both sides of the pixel driving circuit rows 2 in the second direction h2. Taking the orientation shown in FIG. 15 as an example, the repair circuits 41 corresponding to two adjacent pixel driving circuit rows 2 are alternately located on the left and right sides of the pixel driving circuit rows 2. Based on this arrangement, it is possible to avoid providing too many repair circuits 41 on a same side of the pixel driving circuit rows 2. Taking the orientation shown in FIG. 15 as an example, it is possible to avoid providing too many repair circuits 41 on the left or right side of the pixel driving circuit rows 2, thereby avoiding the width of the non-display region NA of the display panel 100 that is located on a side of the pixel driving circuit rows 2 from being too large along the second direction h2.

Exemplarily, as shown in FIG. 14, each of the repair lines RL includes a first portion 71 extending along the first direction h1 and a second portion 72 extending along the second direction h2, and the first portion 71 and the second portion 72 are electrically connected. Along the direction h3 perpendicular to the plane where the substrate 1 is located, the second portion 72 at least partially overlaps with the pixel driving circuit row 2.

For the n2 repair lines RL that at least partially overlap with one repair circuit 41, the second portions 72 in different repair lines RL have the same position relationship with the respective pixel driving circuit rows 2 which they overlap with. The same position relationship means that the process error is within an allowable range, the distances between the different second portions 72 in the n2 repair lines RL that at least partially overlap with one repair circuit 41 and the reference points R in the respective pixel driving circuit rows 2 which they overlap with are the same. The reference point R may be any point in the pixel driving circuit 20. For example, where the reference point R is the location of the drive transistor T3 in the pixel driving circuit 20, it is indicated that the reference points R of different pixel driving circuits 20 each are the location of the drive transistor T3 in each of the pixel driving circuits 20.

As shown in FIG. 14, the pixel driving circuit 20 includes a reference point R. For the second portion 72 overlapping with the pixel driving circuit 20 in the direction h3 perpendicular to the plane where the substrate 1 is located, the distance between the second portion 72 and the reference point R of the pixel driving circuit 20 is d1. In the embodiments of the present disclosure, by "the process error is within an allowable range", it is meant that for the n2 repair lines RL that at least partially overlap with one repair circuit 41, the distances between the different second portions 72 and the reference points R in the respective pixel driving circuit rows 2 which they overlap with are all d1.

As shown in FIG. 14, where the reference point R is exemplified as a point on the edge of the pixel driving circuit 20, when n2=2, for the 2 repair lines RL that at least partially overlap with one repair circuit 41, the distance between the second portion 72 of one repair line RL and the reference point R in the pixel driving circuit row 2 which it overlaps with is d1, and the distance between the second portion 72 of the other repair line RL and the reference point R in the pixel driving circuit row 2 which it overlaps with is also d1.

Or, in the embodiments of the present disclosure, the n2 repair lines RL that at least partially overlap with one repair circuit 41 may be provided to have different position relationships with the respective pixel driving circuit rows 2 which they overlap with. As shown in FIG. 15, when n2=2, for the two repair lines RL that at least partially overlap with one repair circuit 41, the distance between one repair line RL and the reference point R in the pixel driving circuit row 2 which it overlaps with is d11, and the distance between the other repair line RL and the reference point R in the pixel driving circuit row 2 which it overlaps with is d12, with d11>d12.

Exemplarily, in the embodiments of the present disclosure, it is possible to set n2≤6. The greater the number of pixel driving circuit rows 2, the greater the probability that the total number of abnormal pixel drive circuits 20 will increase. In the embodiments of the present disclosure, by setting n2≤6, it is possible to reduce the number of repair circuits 41 while taking into consideration the probability of abnormal pixel driving circuits 20 occurring in the display panel 100. In the case where the number of abnormal pixel driving circuits 20 is greater, all of the abnormal pixel driving circuits 20 may be allowed to be repaired through the repair driving circuits 40, enabling the light-emitting elements 3 to be driven normally, which is conducive to improving the repair reliability of the display panel 100 and improving the display effect.

Optionally, as shown in FIGS. 1, 12, 13, 14, and 15, the first capacitor C1 is located on a side of the repair circuit 41 away from the pixel driving circuit rows 2. As previously mentioned, when setting the repair lines RL, it is necessary to make each of the repair lines RL at least partially overlaps with the repair control transistor T8 and the second reset transistor T7 in the repair circuit 41, as well as at least partially overlap with the pixel driving circuits 20. In the embodiments of the present disclosure, by locating the first capacitor C1 on a side of the repair circuit 41 away from the pixel driving circuit rows 2, the repair circuit 41 may be provided closer to the pixel driving circuit rows 2, thereby being conducive to shortening the length of the repair line RL and weakening the coupling between the repair line RL and other structures in the display panel 100.

Figure 16:
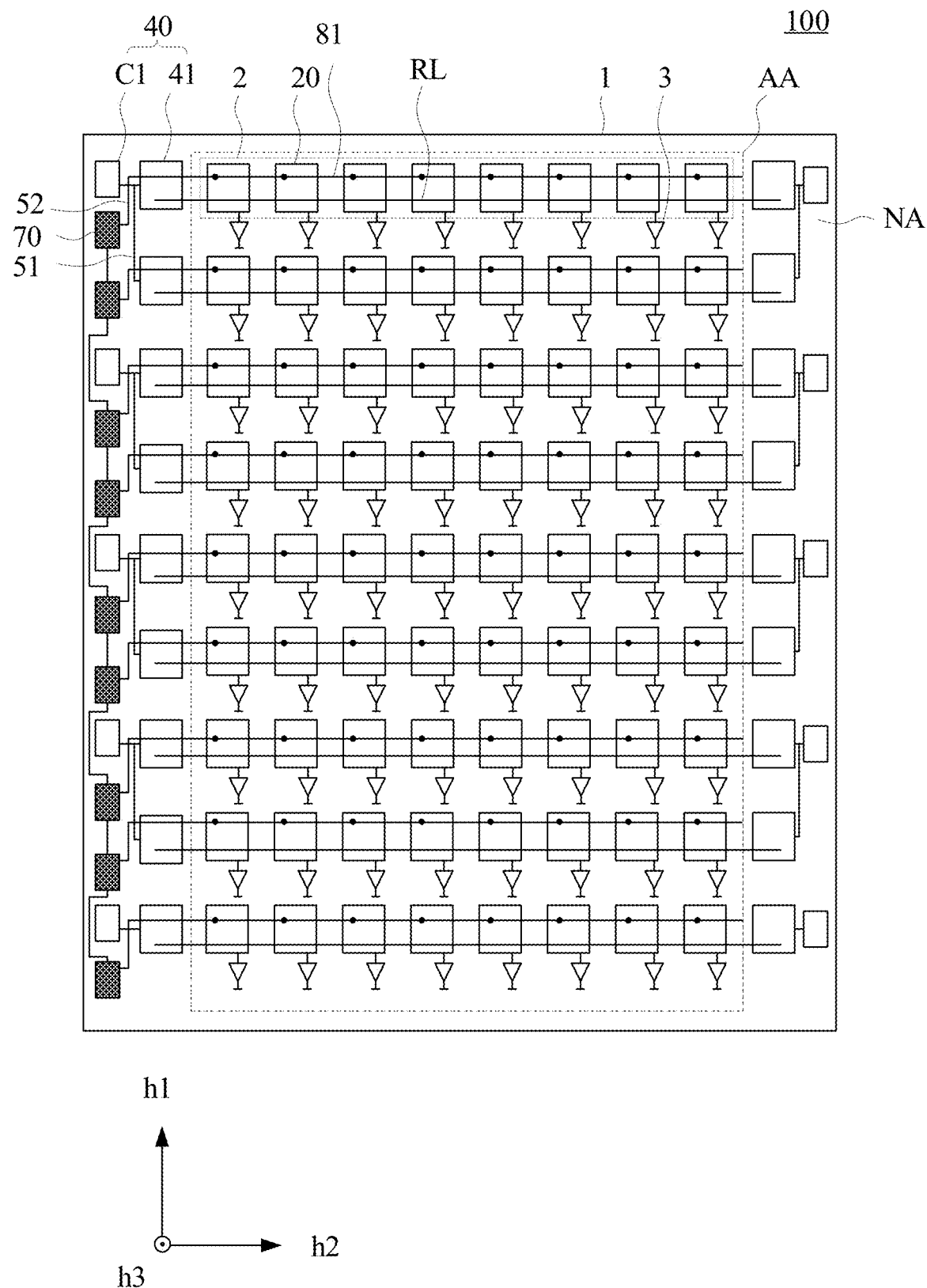
FIG. 16 is a schematic diagram of another display panel provided by an embodiment of the present disclosure.

Exemplarily, as shown in FIG. 16, which is another schematic diagram of a display panel provided by an embodiment of the present disclosure, the display panel 100 further includes a shift register circuit and a plurality of first signal lines 81. Each of the first signal lines 81 is electrically connected to the pixel driving circuits 20 in a pixel driving circuit row 2. The shift register circuit is located in the non-display region NA and includes a plurality of shift register units 70 provided and cascaded along the first direction h1. Each of the shift register units 70 is electrically connected to a first signal line 81, and at least a part of each of the first signal lines 81 is located in the display region AA. Optionally, each of the first signal lines 81 includes any one of the above-mentioned first scan line S1, the second scan line S2, the third scan line S3, and the light emission control line E. Exemplarily, as shown in FIG. 16, each of the first signal lines 81 is also electrically connected to corresponding transistors in a repair circuit 41.

As shown in FIG. 16, along the first direction h1, the first capacitor C1 is located between two adjacent shift register units 70. Based on this arrangement, the shift register units 70 that could otherwise be located on a side of the repair circuits 41 away from the display region AA may be moved close to the display region AA, allowing the shift register units 70 to be placed in the space saved by reducing the first capacitors C1, which can effectively utilize the space in the non-display region NA and narrow the width of the non-display region NA in the second direction h2.

Figure 17:
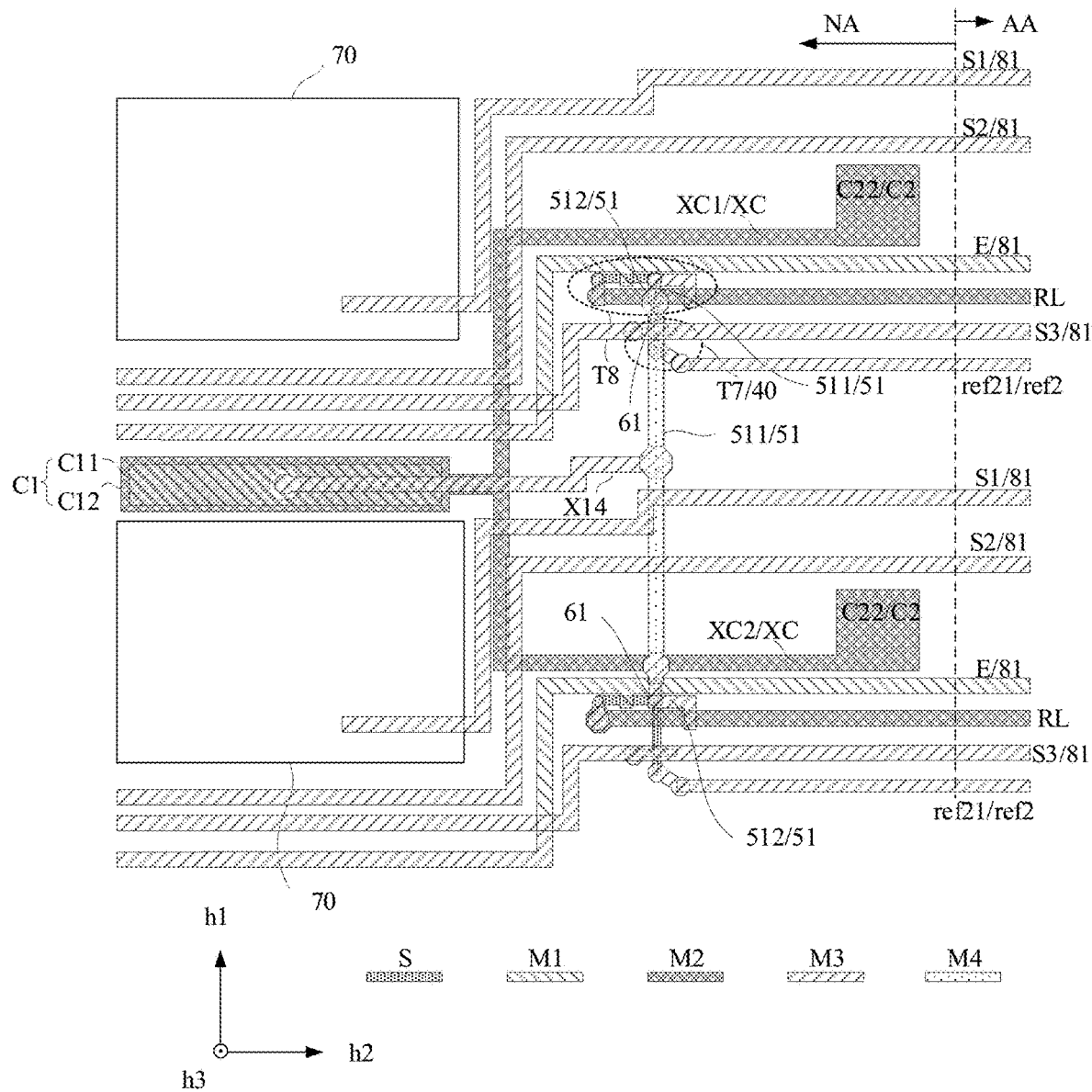
FIG. 17 is a partially enlarged schematic diagram of a display panel provided by an embodiment of the present disclosure.

Exemplarily, as shown in FIG. 17, which is a partially enlarged schematic diagram of a display panel provided by an embodiments of the present disclosure, along a first direction h1, the first capacitor C1 is located between two adjacent shift register units 70. A capacitive connection portion XC, which is electrically connected to the second plate C12 of the first capacitor C1, includes a first sub-capacitive connection portion XC1 and a second sub-capacitive connection portion XC2. The first sub-capacitive connection portion XC1 is electrically connected to the second plate C22 of the second capacitor C2 of one repair circuit 41, and the second sub-capacitive connection portion XC2 is electrically connected to the second plate C22 of the second capacitor C2 in another repair circuit 41. As shown in FIG. 17, the first sub-capacitive connection portion XC1 and the second sub-capacitive connection portion XC2 may both be located in the second conductor layer M2.

Optionally, as shown in FIG. 17, the first connection line 51 includes a first sub-connection line 511 and second sub-connection lines 512 that are electrically connected. The first sub-connection line 511 is electrically connected to the first connection points 61 through the second sub-connection lines 512. The first sub-connection line 511 is located in the fourth conductor layer M4, and the second sub-connection lines 512 are located in the third conductor layer M3. The first sub-connection line 511 and the second sub-connection lines 512 may be electrically connected through via holes.

Exemplarily, as described in FIG. 17, the above-mentioned fourteenth transfer connection structure X14 is electrically connected to the first connection line 51. The fourteenth transfer connection structure X14 may be provided in the above-mentioned third conductor layer M3, and the fourteenth transfer connection structure X14 and the first sub-connection line 511 are electrically connected through a via hole.

Exemplarily, as shown in FIGS. 1, 12, 13, 14, 15, 16, and 17, in the embodiments of the present disclosure, along the second direction h2, the first capacitor C1 may be located on a side of the repair line RL away from the pixel driving circuit rows 2, in order to avoid the overlap between the first capacitor C1 and the repair line RL in the direction h3 perpendicular to the plane where the substrate 1 is located, thereby weakening the coupling between the first capacitor C1 and the repair line RL.

Taking FIG. 17 as an example, in the non-display region NA, the repair line RL terminates at the connection position with the repair control transistor T8 for illustration.

Exemplarily, as shown in FIG. 5, the display panel 100 includes the first conductor layer M1, the second conductor layer M2, the third conductor layer M3, and the fourth conductor layer M4, which are sequentially arranged in a direction h3 perpendicular to the plane where the substrate 1 is located.

Optionally, as shown in FIG. 16, each of the shift register units 70 is electrically connected to the first signal line 81 through a second connection line 52, which is located in the non-display region NA. Exemplarily, in the embodiments of the present disclosure, the first plate C11 of the first capacitor C1 may be provided in the first conductor layer M1, the second plate C12 of the first capacitor C1 may be provided in the second conductor layer M2, at least a part of the first signal line 81 may be provided in the third conductor layer M3, and the second connection line 52 may be provided in the fourth conductor layer M4. Based on the above-mentioned arrangement, along the direction h3 perpendicular to the plane where the substrate 1 is located, the distance between either of the two plates of the first capacitor C1 and the second connection line 52 may be increased. Even if the first capacitor C1 and the second connection line 52 overlap in the direction h3 perpendicular to the plane where the substrate 1 is located, the coupling between the first capacitor C1 and the second connection line 52 may be reduced.

Figure 18:
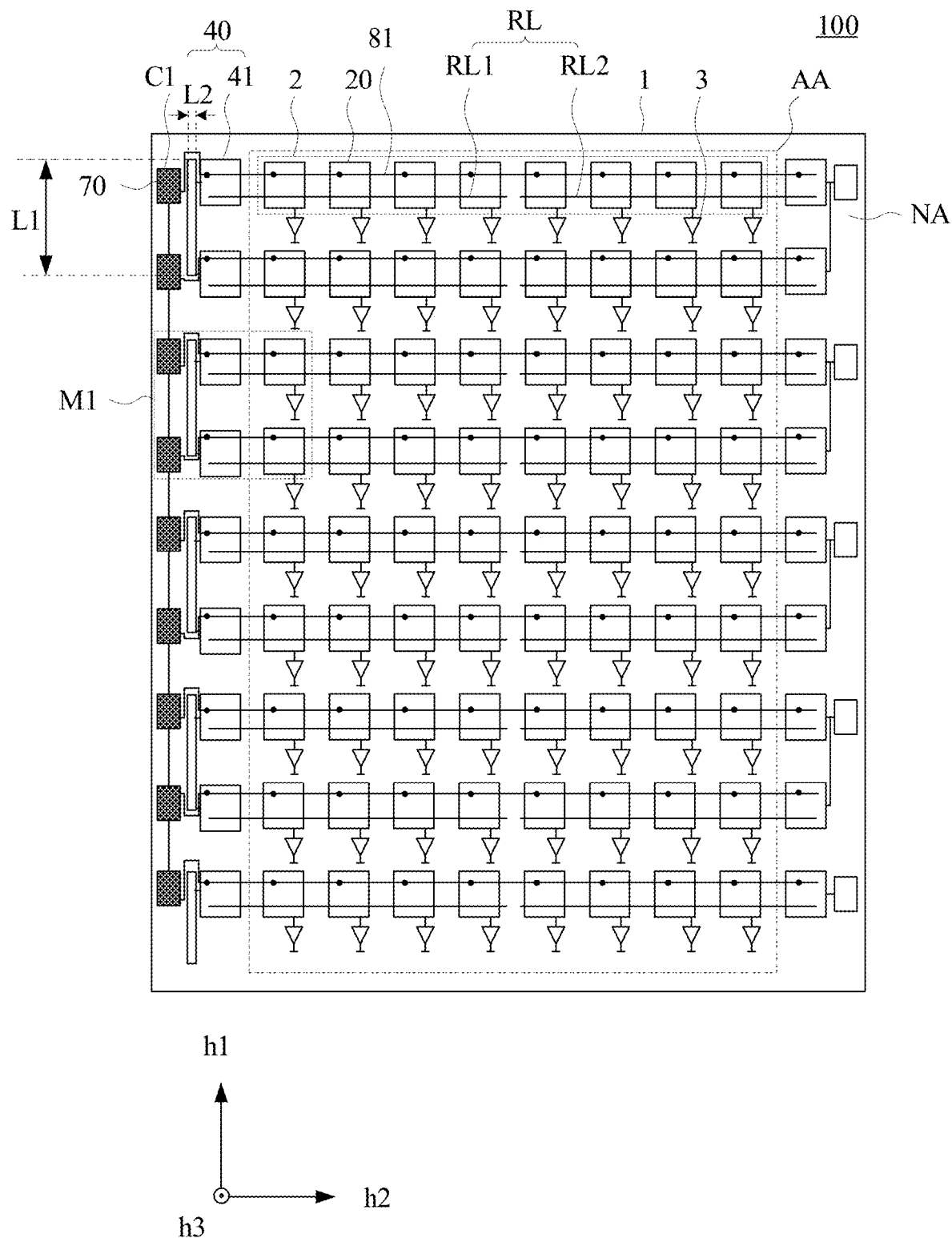
FIG. 18 is a schematic diagram of a further display panel provided by an embodiment of the present disclosure.

Exemplarily, as shown in FIG. 18, which is a schematic diagram of a further display panel provided by an embodiment of the present disclosure, along the first direction h1, a length of the first capacitor C1 is L1, and along the second direction h2, a length of the first capacitor C1 is L2, with L1≥L2. Based on this arrangement, while ensuring the area of the first capacitor C1, the width of the first capacitor C1 in the second direction h2 may be made narrower, whereby the shift register unit 70 located outside the first capacitor C1 can be allowed to be moved as a whole in a direction close to the display region AA, and by "the shift register unit 70 located outside the first capacitor C1", it is meant that the shift register unit 70 is located on a side of the first capacitor C1 away from the display region AA, which is conducive to further reducing the width of the non-display region NA in the second direction h2.

Optionally, as shown in FIG. 18, in the embodiments of the present disclosure, in the second direction h2, the first capacitor C1 may be provided on a side of the shift register unit 70 close to the display region AA.

Figure 19:
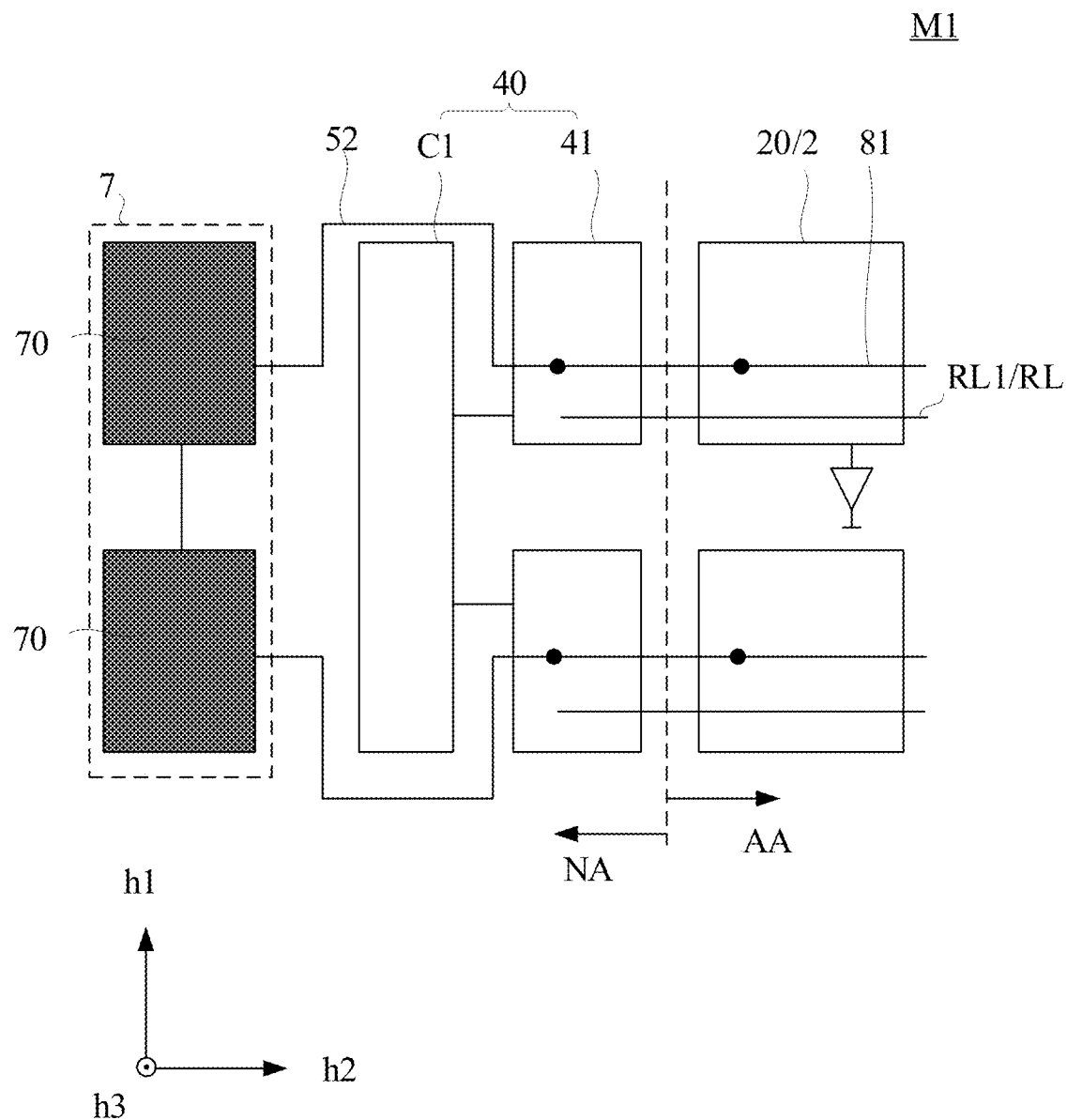
FIG. 19 is an enlarged schematic diagram of a region M1 in FIG. 18.

Exemplarily, as shown in FIG. 19, which is an enlarged schematic diagram of a region M1 in FIG. 18, along the second direction h2, the first capacitor C1 at least partially overlaps with at least two pixel driving circuit rows 2. The display panel 100 further includes a shift register circuit 7, a plurality of the second connection lines 52, and a plurality of first signal lines 81. The second connection lines 52 are located in the non-display region NA, the first signal lines 81 are at least partially located in the display region AA, and the shift register circuit 7 includes a plurality of shift register units 70 arranged and cascaded along the first direction h1.

As shown in FIG. 19, along the direction h3 perpendicular to the plane where the substrate 1 is located, the first capacitor C1 does not overlap with the second connection lines 52, and the second connection lines 52 extend at least partially around the first capacitor C1. In the embodiments of the present disclosure, the second connection lines 52 at least partially extending around the first capacitor C1 may avoid the overlap between the second connection lines 52 and the first capacitor C1, thereby reducing the coupling between the second connection lines 52 and the first capacitor C1.

Figure 20:
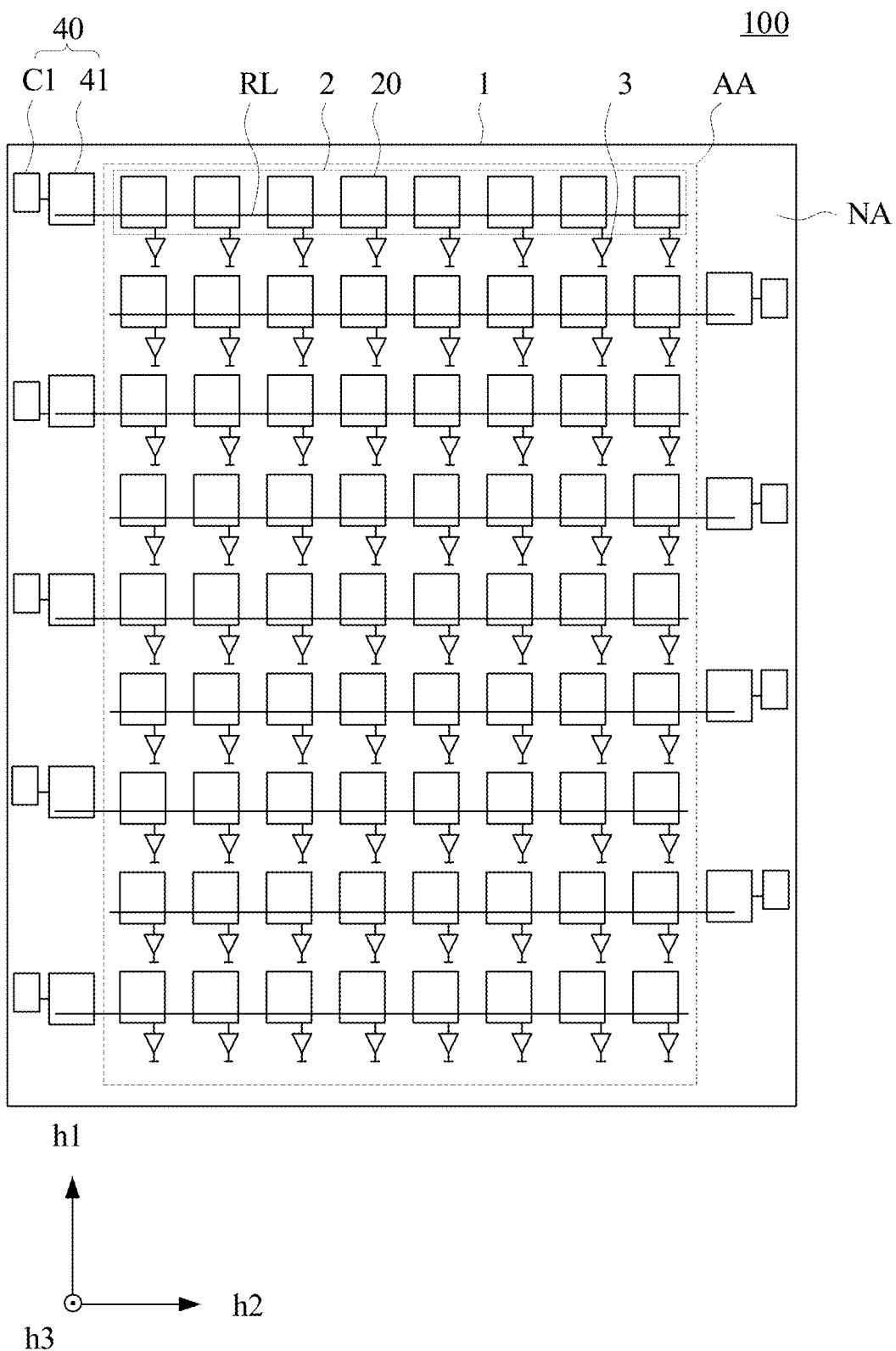
FIG. 20 is a schematic diagram of a further display panel provided by an embodiment of the present disclosure.

Optionally, as shown in FIG. 20, which is a schematic diagram of a further display panel provided by an embodiment of the present disclosure, one pixel driving circuit row 2 corresponds to one repair driving circuit 40. Each of the repair driving circuits 40 includes one of the above-mentioned repair circuits 41 and one of the above-mentioned first capacitors C1, and the repair circuit 41 and the first capacitor C1 are electrically connected.

Exemplarily, as shown in FIG. 20, along the second direction h2, the repair driving circuit 40 corresponding to the jth pixel driving circuit row 2 is located on one side of the pixel driving circuit rows 2, and the repair driving circuit 40 corresponding to the (j−1)th pixel driving circuit row 2 is located on the other side of the pixel driving circuit rows 2, where j is an integer, and 2≤j≤N1. That is, two repair driving circuits 40 corresponding to two adjacent pixel driving circuit rows 2 are located on opposite sides of the pixel driving circuit rows 2 in the second direction h2. Taking the orientation shown in FIG. 19 as an example, the repair driving circuits 40 corresponding to two adjacent pixel driving circuit rows 2 alternately located on the left and right sides of the pixel driving circuit rows 2. Based on this arrangement, the number of repair driving circuits 40 located on a same side of the pixel driving circuit rows 2 can be reduced, and in turn the width of the non-display region NA on a side of the pixel driving circuit rows 2 in the second direction h2 can be reduced. Taking the orientation shown in FIG. 20 as an example, the provision of too many repair driving circuits 40 on the left or right side of the pixel driving circuit rows 2 may be avoided.

Figure 21:
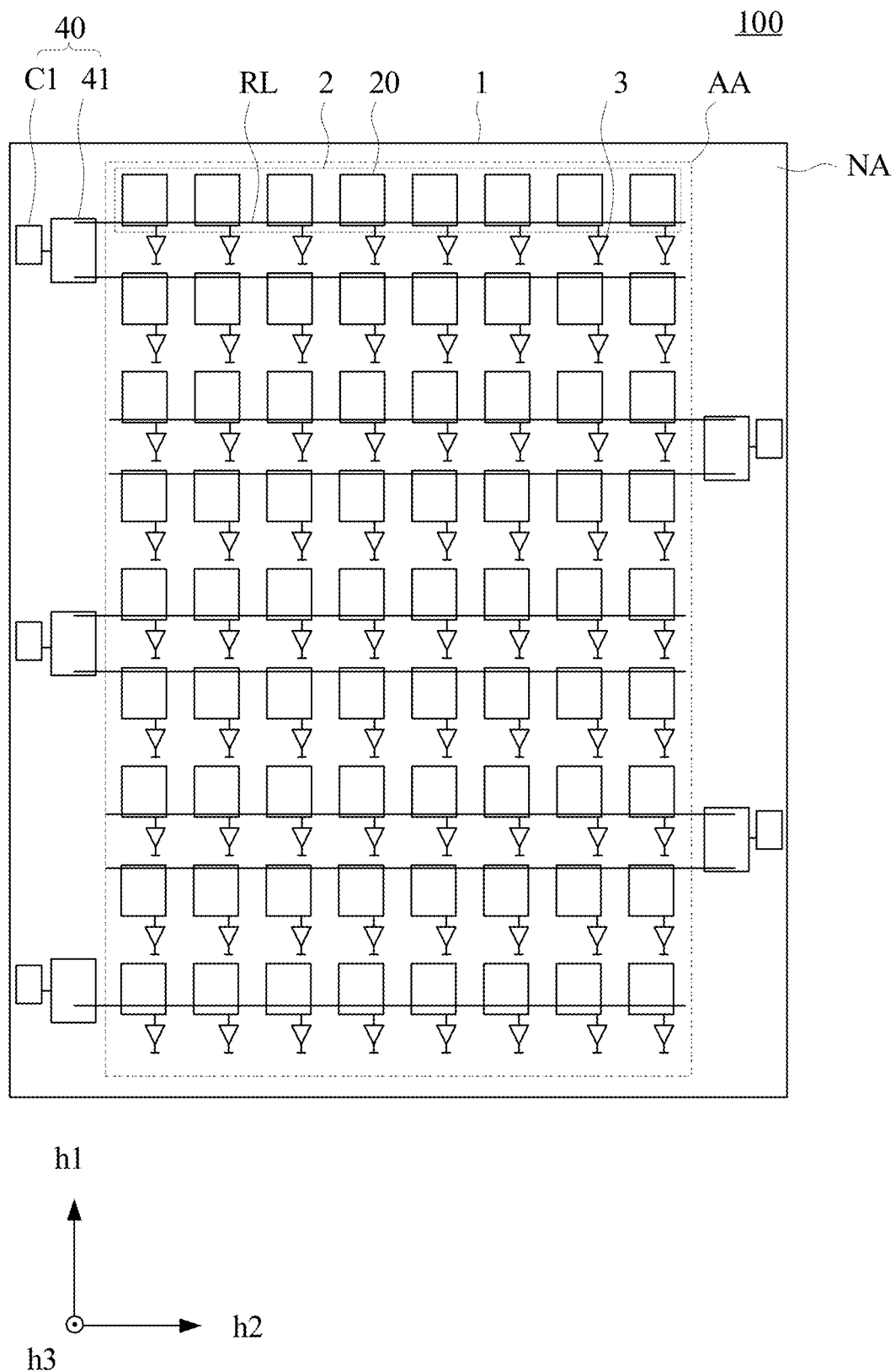
FIG. 21 is a schematic diagram of a further display panel provided by an embodiment of the present disclosure.

Optionally, in the embodiments of the present disclosure, along the direction h3 perpendicular to the plane where the substrate 1 is located, it is possible to allow one repair driving circuit 40 to at least partially overlap with n3 repair lines RL, and one repair line RL to at least partially overlap with one pixel driving circuit row 2, where n3≥2, and n3 is an integer. As shown in FIG. 21, which is a schematic diagram of a further display panel provided by an embodiment of the present disclosure, take n3=2 as an example, where along the direction h3 perpendicular to the plane where the substrate 1 is located, one repair driving circuit 40 overlaps with 2 repair lines RL.

It should be noted that the arrangement of the repair lines RL shown in FIG. 21 and their position relationship with the pixel driving circuit rows 2 are illustrative only. When one pixel driving circuit row 2 corresponds to one repair driving circuit 40 and each of the repair driving circuits 40 includes one repair circuit 41 and one first capacitor C1, the embodiment of the present disclosure may also be adjusted according to the arrangement as shown in FIG. 14. That is, the repair line RL may also be designed to include a first portion 71 and a second portion 72. For the n2 repair lines RL that at least partially overlap with one repair circuit 41, the second portions 72 of the n2 repair lines RL may be designed to have the same position relationship with their respective pixel driving circuit rows 2 which they overlap with. The same position relationship means that the process error is within a same allowable range. The distances between different second portions 72 of the n2 repair lines RL that at least partially overlap with one repair circuit 41 and the reference points R in their respective pixel driving circuit rows 2 which they overlap with are the same.

By "in the direction h3 perpendicular to the plane where the substrate 1 is located, the repair line RL at least partially overlaps with the pixel driving circuit row 2", it is meant that along the direction h3 perpendicular to the plane where the substrate 1 is located, the repair line RL at least partially overlaps with the above-mentioned first transfer connection structure X101 in the pixel driving circuit row 2. When a pixel driving circuit 20 is abnormal, the repair line RL may be fused with the first transfer connection structure X101 to electrically connect the repair line RL and the anode 31 of the light-emitting element 3, enabling the driving current provided by the repair driving circuit 40 to be supplied to the corresponding light-emitting element 3 through the repair line RL.

By "along the direction h3 perpendicular to the plane where the substrate 1 is located, the repair driving circuit 40 at least partially overlaps with the repair line RL", it is meant that along the direction h3 perpendicular to the plane where the substrate 1 is located, the second transfer connection structure X6 in the repair driving circuit 40 and the repair line RL at least partially overlap, and the third transfer connection structure X3 in the repair driving circuit 40 and the repair line RL at least partially overlap. When the repair driving circuit 40 participates in repair, the overlapping position between the second transfer connection structure X2 in the repair driving circuit 40 and the repair line RL may be fused, and the overlapping position between the third transfer connection structure X3 in the repair driving circuit 40 and the repair line RL may also be fused, to electrically connect the second light emission control transistor T6 in the repair driving circuit 40 and the repair line RL and to electrically connect the second reset transistor T6 in the repair driving circuit 40 and the repair line RL.

In the embodiments of the present disclosure, along the direction h3 perpendicular to the plane where the substrate 1 is located, by one repair driving circuit 40 at least partially overlapping with the n3 repair lines RL, the number of repair driving circuits 40 may be reduced, thereby decreasing the area occupied by a plurality of repair driving circuits 40.

Optionally, in the embodiments of the present disclosure, it is possible to set n3≤6. The greater the number of pixel driving circuit rows 2, the greater the probability that the total number of abnormal pixel drive circuits 20 will increase. In the embodiments of the present disclosure, by setting n3≤6, it is possible to reduce the number of repair driving circuits 40 while taking into consideration the probability of abnormal pixel driving circuits 20 occurring in the display panel 100. In the case where the number of abnormal pixel driving circuits 20 is greater, all of the abnormal pixel driving circuits 20 may be allowed to be repaired through the repair driving circuits 40, enabling the light-emitting elements 3 to be driven normally, which is conducive to improving the repair reliability of the display panel 100 and improving the display effect.

Exemplarily, as shown in FIGS. 1, 12, 13, 14, 15, 16, 18, 19, 20, and 21, the non-display region NA of the display panel 100 includes the above-mentioned repair driving circuits 40. In the embodiments of the present disclosure, by providing the repair driving circuits 40 in the non-display region NA, it is possible to reduce the impact of the arrangement of the repair driving circuits 40 on the structures in the display region AA.

In another optional implementation, in the embodiments of the present disclosure, the repair driving circuits 40 may also be provided in the display region AA to narrow the width of the non-display region NA in the second direction h2 to a greater extent.

Figure 22:
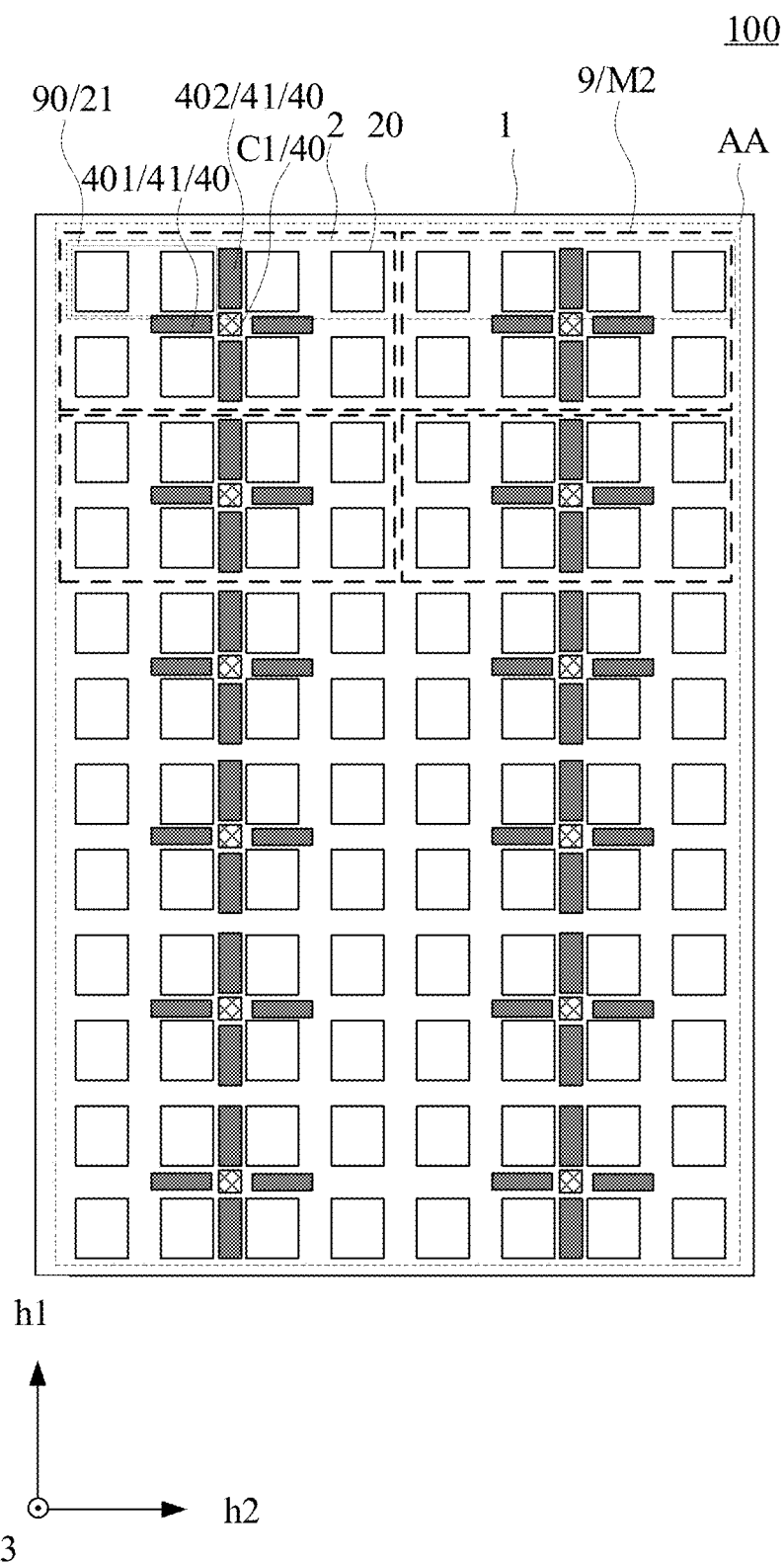
FIG. 22 is a schematic diagram of a further display panel provided by an embodiment of the present disclosure.

Exemplarily, as shown in FIG. 22, which is a schematic diagram of a further display panel provided by an embodiment of the present disclosure, the display region AA includes a plurality of repeating units 9 arranged in an array along the first direction h1 and the second direction h2. Each of the repeating units 9 includes four repeating sub-units 90 arranged in an array along the first direction h1 and the second direction h2. Each of the repeating sub-unit 90 includes m sub-pixel driving circuit rows 21 arranged along the first direction h1, where m is an integer greater than or equal to 1. FIG. 22 takes m=1 as an example, where each of the repeating sub-unit 90 includes one sub-pixel driving circuit row 21 arranged along the first direction h1. The sub-pixel driving circuit row 21 includes a plurality of pixel driving circuits 20. Additionally, the number of pixel driving circuits 20 in the sub-pixel driving circuit row 21 is less than the number of pixel driving circuits 20 in the pixel driving circuit row 2.

As shown in FIG. 22, the above-mentioned repair circuit 41 further includes first repair circuits 401 and second repair circuits 402 located within a repeating unit 9. Along the first direction h1, the first repair circuits 401 are located between adjacent repeating sub-units 90. Along the second direction h2, the second repair circuits 402 are located between adjacent repeating sub-units 90.

In FIG. 22, to facilitate understanding of the drawings and enhance the distinguishability between different structures, different fill patterns are used to illustrate the repair circuit 41 and the first capacitor C1. Although the repair circuit 41 and the first capacitor C1 are not filled with patterns in figures such as FIGS. 1, 12, 13, 14, 15, 16, 18, 19, 20, and 21, it should be understood that the repair circuit 41 in FIG. 22 may adopt a same structure as the repair circuit 41 shown in the above-mentioned figures such as FIGS. 1 and 12, and the first capacitor C1 in FIG. 22 may also adopt a same structure as the first capacitor C1 shown in the above-mentioned figures such as FIGS. 1 and 12.

Figure 23:
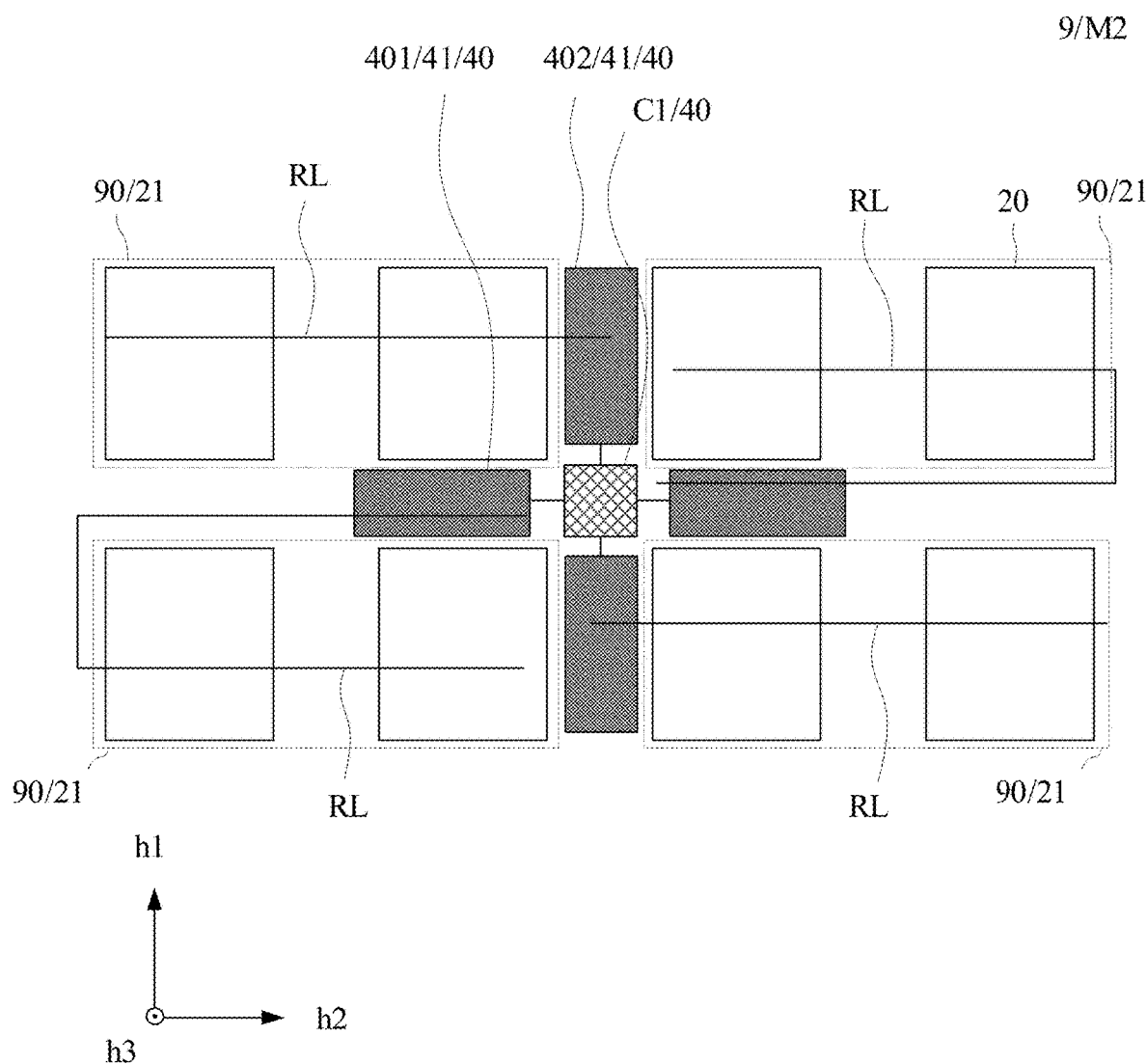
FIG. 23 is an enlarged schematic diagram of a repeating unit located in a region M2 in FIG. 22.

As shown in conjunction with FIGS. 22 and 23, FIG. 23 is an enlarged schematic diagram of a repeating unit located in a region M2 in FIG. 22. The repeating unit 9 further includes the above-mentioned first capacitor C1. The first repair circuits 401 and the second repair circuit 402 located in a same repeating unit 9 are connected to a same first capacitor C1. Based on this arrangement, it is possible to allow one first capacitor C1 to be connected to four repair circuits 41 and to further reduce the number of first capacitors C1, thereby further reducing the space occupied by the first capacitors C1. It should be noted that for more clarity of the figure, the repair lines are not shown in FIG. 22.

Figure 24:
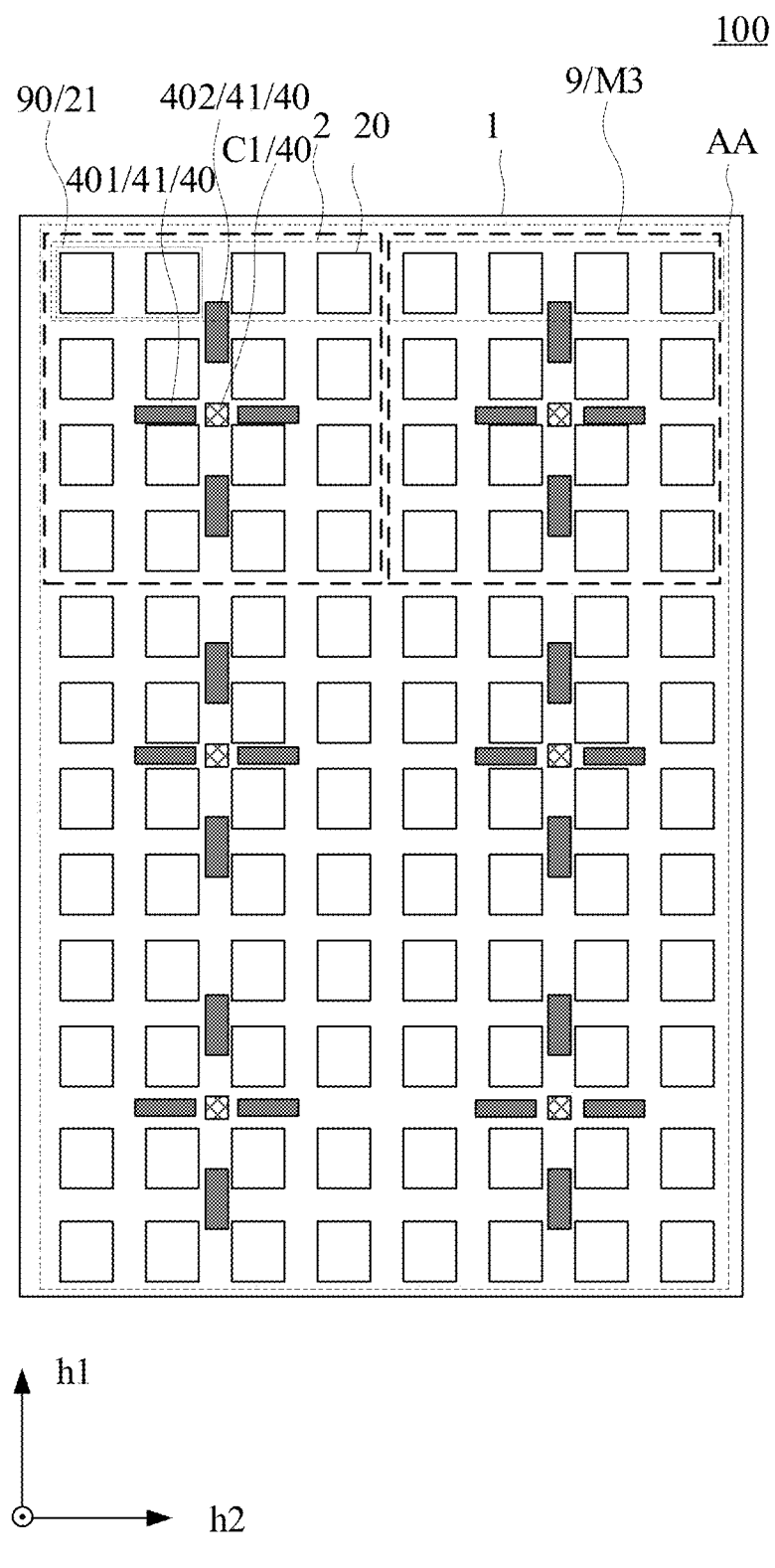
FIG. 24 is a schematic diagram of another display panel provided by an embodiment of the present disclosure.
Figure 25:
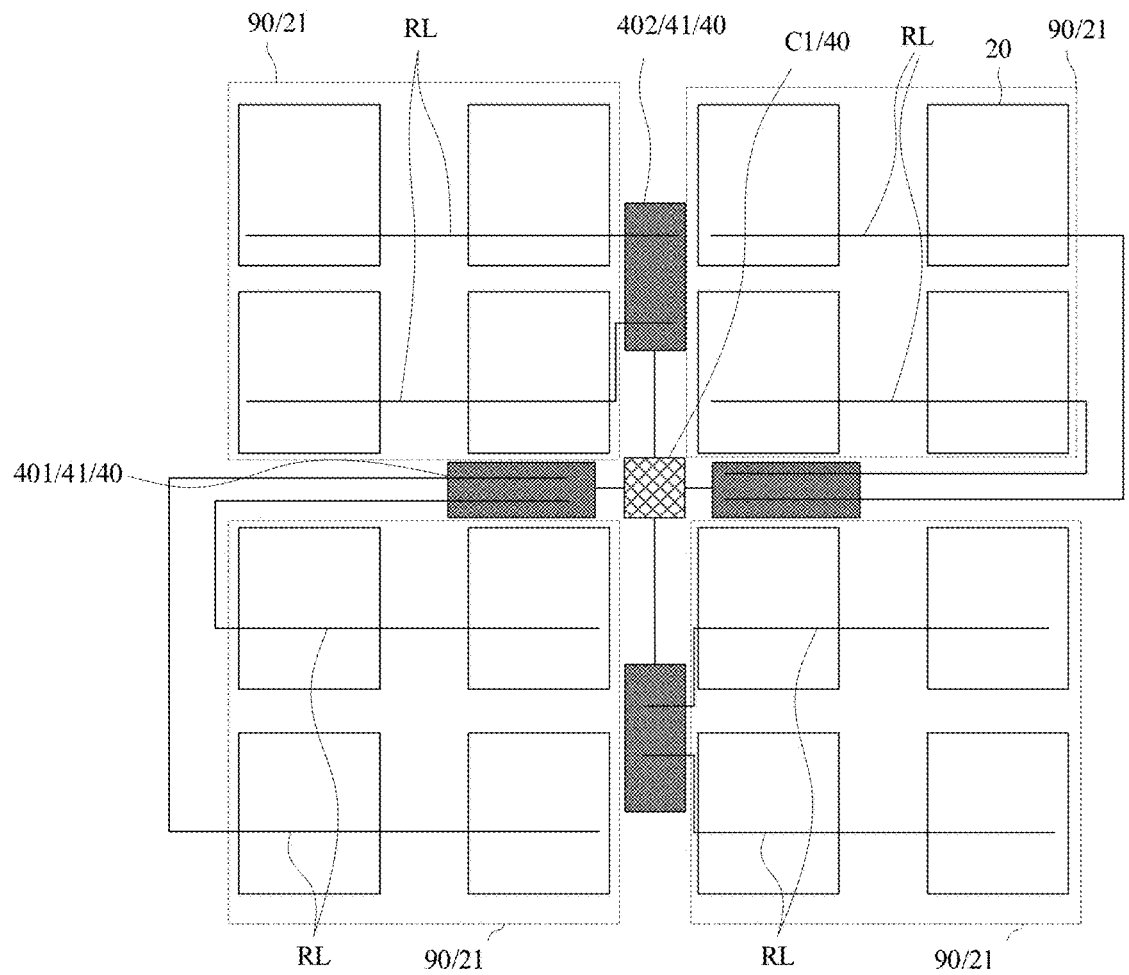
FIG. 25 is an enlarged schematic diagram of a repeating unit located in a region M3 in FIG. 24.

In the embodiments of the present disclosure, one repeating unit 9 includes 4 m repair lines RL. Along the direction h3 perpendicular to the plane where the substrate 1 is located, one repair line RL at least partially overlaps with one sub-pixel driving circuit row 21, one repair line RL at least partially overlaps with one repair circuit 41, and one repair circuit 41 at least partially overlaps with m repair lines RL. FIG. 23 takes m=1 as an example, where one repeating unit 9 includes 4 repair lines RL. Or, as shown in FIGS. 24 and 25, FIG. 24 is a schematic diagram of a further display panel provided by an embodiment of the present disclosure, and FIG. 25 is an enlarged schematic diagram of a repeating unit located in a region M3 in FIG. 24, where m=2 is taken as an example. It should be noted that for more clarity of the figure, the repair lines are not shown in FIG. 24.

Figure 26:
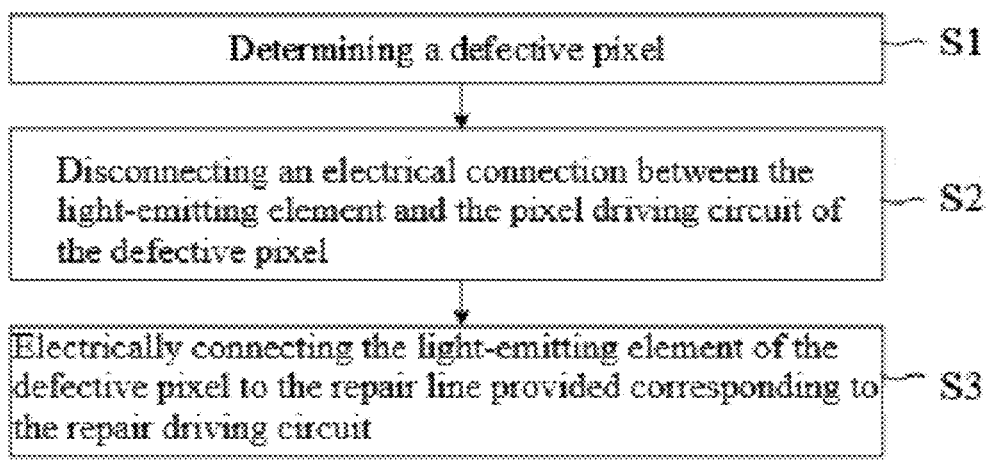
FIG. 26 is a schematic diagram of a pixel repair method for a display panel provided by an embodiment of the present disclosure.

Based on the same inventive concept, the embodiments of the present disclosure also provide a pixel repair method for a display panel 100. As shown in FIG. 26, which is a schematic diagram of the pixel repair method for the display panel provided by an embodiment of the present disclosure, the pixel repair method is applied to the above-mentioned display panel 100. The method includes:

Step S1: determining a defective pixel. Exemplarily, in the embodiment of the present disclosure, a light-emitting element 3 emitting light abnormally may be identified firstly, and then the pixel corresponding to the light-emitting element 3 can be determined as the defective pixel.

Step S2: disconnecting an electrical connection between the light-emitting element 3 and the pixel driving circuit 20 of the defective pixel. Specifically, as shown in FIG. 2B, in the embodiment of the present disclosure, the electrical connection between the light-emitting element 3 and the second light emission control transistor T6 in the pixel driving circuit 20 may be disconnected at the first disconnection point F1 or the second disconnection point F2 shown in FIG. 2B. Exemplarily, disconnecting the electrical connection between two components in the display panel 100 may be implemented through laser fusing.

Step S3: electrically connecting the light-emitting element 3 of the defective pixel to the repair line RL provided corresponding to the repair driving circuit 40. Optionally, as shown in conjunction with FIGS. 2A, 2B, and 4, in the embodiments of the present disclosure, the repair line RL and the above-mentioned first transfer connection structure X101 (not shown in FIGS. 2A and 2B) may be fused at the overlapping position therebetween, i.e., at the first parasitic capacitance Q1 as shown in FIGS. 2A and 2B. Specifically, when the pixel driving circuit 20_1 is abnormal, the fusing occurs at the first parasitic capacitance Q1_1, and when the pixel driving circuit 20_2 is abnormal, the fusing occurs at the first parasitic capacitance Q1_2.

As shown in FIG. 4, since the first transfer connection structure X101 is electrically connected to the anode 31 of the light-emitting element 3, the repair line RL can be electrically connected to the anode 31 of the light-emitting element 3 through the first transfer connection structure X101. Optionally, the above-mentioned fusing operation includes laser fusing.

Optionally, the repair method provided by the embodiment of the present disclosure further includes: electrically connecting the repair driving circuit 40 to the repair lines RL. Specifically, in the embodiment of the present disclosure, the above-mentioned second transfer connection structure X2 and the repair line RL may be fused at the overlapping position therebetween. Additionally, the above-mentioned third transfer connection structure X3 and the repair line RL may be fused at the overlapping position therebetween. Exemplarily, as shown in FIG. 4, in the embodiment of the present disclosure, the second transfer connection structure X2 may also be electrically connected to the repair line RL. In this case, when the repair driving circuit 40 is enabled to participate in pixel repair, it is not necessary to perform fusing at the overlapping position between the second transfer connection structure X2 and the repair line RL, and it is only necessary to fuse the third transfer connection structure X3 and the repair line RL at the overlapping position therebetween, i.e., at the second parasitic capacitance Q2 as illustrated in FIG. 2A, to achieve the electrical connection of the second reset transistor T7 and the first capacitor C1 in the repair driving circuit 40 to the repair line RL.

Figure 27:
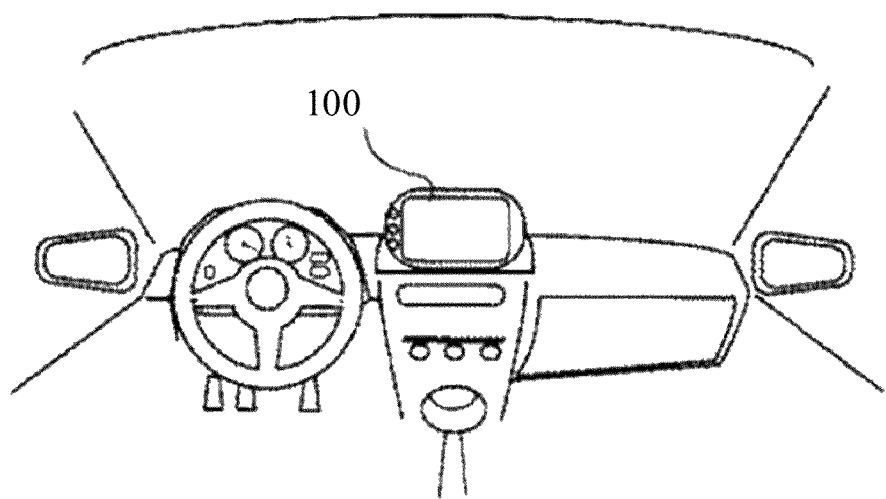
FIG. 27 is a schematic diagram of a display apparatus provided by an embodiment of the present disclosure.

Based on the same inventive concept, an embodiment of the present disclosure further provides a display apparatus. As shown in FIG. 27, which is a schematic diagram of the display apparatus provided by the embodiment of the present disclosure, the display apparatus includes the above-mentioned display panel 100. The specific structure of the display panel 100 has been described in detail in the above embodiments and will not be repeated here. Certainly, the display apparatus shown in FIG. 27 is merely illustrative, and the display apparatus may be any device with display functionality, such as a mobile phone, tablet computer, laptop computer, electronic paper book, television, smartwatch, etc. When the display panel is applied in a transportation means such as an automobile, ship, or airplane and used as a display screen, it may be a structure independent from the inherent structures in the transportation means, or it may be a local structure provided to be integrated with other structural components in the transportation means. For example, the display panel may be provided to be integrated with a front windshield or a dashboard surrounding an instrument panel, which is not limited by the embodiments of the present disclosure.

The above descriptions are merely preferred embodiments of the present disclosure and are not intended to limit the present disclosure. Any modification, equivalent replacement and improvement within the spirit and principle of the present disclosure shall be comprised within the protection scope of the present disclosure.

What is claimed is:

1. A display panel, comprising:
   a substrate;
   N1 pixel driving circuit rows arranged along a first direction and located on a side of the substrate, wherein each of the pixel driving circuit rows comprises a plurality of pixel driving circuits arranged along a second direction, and the first direction intersects with the second direction;
   a plurality of light-emitting elements, each of the plurality of light-emitting elements is electrically connected to one of the pixel driving circuits;
   repair lines; and
   repair driving circuits,
   wherein along a direction perpendicular to a plane where the substrate is located, each of the repair lines at least partially overlaps with one of the repair driving circuits and also the pixel driving circuits;
   wherein each of the repair driving circuits comprises a repair circuit and a first capacitor that are electrically connected, the repair circuit comprises at least two transistors and a second capacitor, and a capacitance of the first capacitor is greater than or equal to a capacitance of the second capacitor; and
   wherein a number of first capacitors is N2, where both N1 and N2 are positive integers, and N2<2N1.

2. The display panel according to claim 1, wherein n1 repair circuits located on a same side of the pixel driving circuit rows and adjacent along the first direction are connected to a same first capacitor, where n1≥2, and n1 is an integer.

3. The display panel according to claim 2, wherein the first capacitor comprises a first plate and a second plate, the first plate is electrically connected, through at least one first connection line, to first connection points of the n1 repair circuits located on the same side of the pixel driving circuit rows and adjacent along the first direction, and the second plate is electrically connected to a fixed signal terminal.

4. The display panel according to claim 2, wherein
   one pixel driving circuit row corresponds to one repair circuit; and
   along the second direction, the repair circuit corresponding to an ith pixel driving circuit row is located on one side of the pixel driving circuit rows, and the repair circuit corresponding to an (i−1)th pixel driving circuit row is located on the other side of the pixel driving circuit rows, where i is an integer, and 2≤i≤N1.

5. The display panel according to claim 2, wherein
   one pixel driving circuit row corresponds to two repair circuits; and along the second direction, the two repair circuits corresponding to a same pixel driving circuit row are located on both sides of the pixel driving circuit rows, respectively.

6. The display panel according to claim 5, wherein
each of the repair lines comprises a first repair sub-line and a second repair sub-line, along the direction perpendicular to the plane where the substrate is located, one of the two repair circuits corresponding to the same pixel driving circuit row at least partially overlaps with the first repair sub-line, the other one of the two repair circuits at least partially overlaps with the second repair sub-line, and the first repair sub-line and the second repair sub-line each overlap with different pixel driving circuits in the same pixel driving circuit row.

7. The display panel according to claim 2, wherein
along the direction perpendicular to the plane where the substrate is located, one repair circuit at least partially overlaps with n2 repair lines, and one of the repair lines at least partially overlaps with one pixel driving circuit row, where n2≥2, and n2 is an integer.

8. The display panel according to claim 2, wherein the first capacitor is located on a side of the repair circuit away from the pixel driving circuit rows.

9. The display panel according to claim 2, further comprising a shift register circuit and a plurality of first signal lines, wherein the shift register circuit comprises a plurality of shift register units arranged and cascaded along the first direction, each of the shift register units is electrically connected to one of the first signal lines, and the one of the first signal lines is electrically connected to one of the pixel driving circuit rows; and
along the first direction, the first capacitor is located between two adjacent shift register units.

10. The display panel according to claim 2, wherein
along the first direction, a length of the first capacitor is L1, and along the second direction, a length of the first capacitor is L2, where L1≥L2.

11. The display panel according to claim 1, wherein
along the second direction, the first capacitor is located on a side of the repair lines away from the pixel driving circuit rows.

12. The display panel according to claim 1, further comprising a display region, a non-display region, a shift register circuit, a plurality of second connection lines, and a plurality of first signal lines;
wherein along the second direction, the first capacitor at least partially overlaps with at least two pixel driving circuit rows;
the second connection lines are located in the non-display region, the first signal lines are at least partially located in the display region, the shift register circuit comprises a plurality of shift register units arranged and cascaded along the first direction, each of the shift register units is electrically connected to one of the first signal lines through one of the second connection lines, and the one of the first signal lines is electrically connected to one of the pixel driving circuit rows; and
along the direction perpendicular to the plane where the substrate is located, the first capacitor does not overlap with the second connection lines, and the second connection lines extend at least partially around the first capacitor.

13. The display panel according to claim 1, further comprising a display region, a non-display region, a shift register circuit, a plurality of second connection lines, and a plurality of first signal lines;

wherein along the second direction, the first capacitor at least partially overlaps with at least two of the pixel driving circuit rows;
the plurality of second connection lines are located in the non-display region, the plurality of first signal lines are at least partially located in the display region, the shift register circuit comprises a plurality of shift register units arranged and cascaded along the first direction, each of the shift register units is electrically connected to one of the first signal lines through one of the second connection lines, and the one of the first signal lines is electrically connected to one of the pixel driving circuit rows;
the display panel further comprises a first conductor layer, a second conductor layer, a third conductor layer, and a fourth conductor layer arranged sequentially along the direction perpendicular to the plane where the substrate is located; and
a first plate of the first capacitor is located in the first conductor layer, a second plate of the first capacitor is located in the second conductor layer, the plurality of first signal lines are located in the third conductor layer, and the plurality of second connection lines are located in the fourth conductor layer.

14. The display panel according to claim 1, wherein
one pixel driving circuit row corresponds to one repair driving circuit, and each of the repair driving circuits comprises one first capacitor.

15. The display panel according to claim 14, wherein
along the second direction, the repair driving circuit corresponding to a jth pixel driving circuit row is located on a side of the pixel driving circuit rows, and the repair driving circuit corresponding to a (j−1)th pixel driving circuit row is located on the other side of the pixel driving circuit rows, where j is an integer, and 2≤j≤N1.

16. The display panel according to claim 14, wherein
along the direction perpendicular to the plane where the substrate is located, one repair driving circuit at least partially overlaps with n3 repair lines, and each of the repair lines overlaps with one pixel driving circuit row, where n3≥2, and n3 is an integer.

17. The display panel according to claim 1, further comprising a non-display region, wherein the non-display region comprises the repair driving circuits.

18. The display panel according to claim 1, further comprising a display region, wherein the display region comprises the repair driving circuits.

19. The display panel according to claim 18, wherein
the display region comprises a plurality of repeating units arranged in an array along the first direction and the second direction, each of the repeating units comprises four repeating sub-units arranged in an array along the first direction and the second direction; each of the repeating sub-units comprises at least one sub-pixel driving circuit row arranged along the first direction, and the sub-pixel driving circuit row comprises a plurality of the pixel driving circuits, a number of the pixel driving circuits in the sub-pixel driving circuit row is less than a number of the pixel driving circuits in the pixel driving circuit row;
each of the repeating units further comprises first repair circuits and second repair circuits, each of the first repair circuits is located between two adjacent repeating sub-units along the first direction, and each of the second repair circuit is located between two adjacent repeating sub-units; and each of the repeating units further comprises the first capacitor, and the first repair circuits and the second repair circuits in a same repeating unit are connected to a same first capacitor.

20. The display panel according to claim 1, further comprising a driving circuit layer, an anode metal layer, and first transfer connection structures located on the side of the driving circuit layer away from the substrate, wherein the driving circuit layer comprises the pixel driving circuits and the repair driving circuits, and the light-emitting elements are located on a side of the driving circuit layer away from the substrate, an anode of each of the light-emitting elements is located in the anode metal layer; and
the first transfer connection structures are located on a side of the repair lines away from the substrate, and each of the first transfer connection structures is electrically connected to the anode of one light-emitting element; along the direction perpendicular to the plane where the substrate is located, each of the repair lines at least partially overlaps with one first transfer connection structure.

21. The display panel according to claim 1, further comprising a light emission control line, a power supply voltage line, a first scan line, a second scan line, a third scan line, a repair data line, a first reset voltage line, and a second reset voltage line;
wherein the transistors comprises a drive transistor, a data writing transistor, a first reset transistor, a second reset transistor, a threshold compensation transistor, a first light emission control transistor, and a second light emission control transistor;
a first electrode of the first light emission control transistor is electrically connected to the power supply voltage line, a second electrode of the first light emission control transistor is electrically connected to a first electrode of the drive transistor, and a gate of the first light emission control transistor is electrically connected to the light emission control line;
a first electrode of the first reset transistor is electrically connected to the first reset voltage line, a second electrode of the first reset transistor is electrically connected to a gate of the drive transistor, and a gate of the first reset transistor is electrically connected to the first scan line;
a first electrode of the threshold compensation transistor is electrically connected to a second electrode of the drive transistor, a second electrode of the threshold compensation transistor is electrically connected to the gate of the drive transistor, and a gate of the threshold compensation transistor is electrically connected to the second scan line;
a first electrode of the data writing transistor is electrically connected to the repair data line, a second electrode of the data writing transistor is electrically connected to the first electrode of the drive transistor, and a gate of the data writing transistor is electrically connected to the second scan line;
a first plate of the first capacitor is connected to a second electrode of the second reset transistor, and a second plate of the first capacitor is electrically connected to the power supply voltage line;
a first plate of the second capacitor is electrically connected to the power supply voltage line, and a second plate of the second capacitor is electrically connected to the gate of the drive transistor;
a first electrode of the second light emission control transistor is electrically connected to the second electrode of the drive transistor, a gate of the second light emission control transistor is electrically connected to the light emission control line, a second electrode of the second light emission control transistor is located in an active layer and is electrically connected to a second transfer connection structure, the second transfer connection structure is located on a side of the active layer away from the substrate, and along the direction perpendicular to the plane where the substrate is located, the second transfer connection structure at least partially overlaps with one repair line;
a first electrode of the second reset transistor is electrically connected to the second reset voltage line, a gate of the second reset transistor is electrically connected to the third scan line, the second electrode of the second reset transistor is located in the active layer and is electrically connected to a third transfer connection structure, the third transfer connection structure is located on the side of the active layer away from the substrate, and along the direction perpendicular to the plane where the substrate is located, the third transfer connection structure at least partially overlaps with the one repair line.

22. The display panel according to claim 21, wherein the transistors further comprises a repair control transistor, a first electrode of the repair control transistor is electrically connected to the second electrode of the second reset transistor, a second electrode of the repair control transistor is electrically connected to one of the repair line, and a gate of the repair control transistor is electrically connected to the light emission control line.

23. A pixel repair method for a display panel,
wherein the display panel comprises:
a substrate;
N1 pixel driving circuit rows arranged along a first direction and located on a side of the substrate, wherein each of the pixel driving circuit rows comprises a plurality of pixel driving circuits arranged along a second direction, and the first direction intersects with the second direction;
a plurality of light-emitting elements, each of the plurality of light-emitting elements is electrically connected to one of the pixel driving circuits;
repair lines; and
repair driving circuits,
wherein along a direction perpendicular to a plane where the substrate is located, each of the repair lines at least partially overlaps with one of the repair driving circuits and also the pixel driving circuits;
wherein each of the repair driving circuits comprises a repair circuit and a first capacitor that are electrically connected, the repair circuit comprises at least two transistors and a second capacitor, and a capacitance of the first capacitor is greater than or equal to a capacitance of the second capacitor; and
wherein a number of first capacitors is N2, where both N1 and N2 are positive integers, and N2<2N1, and
wherein the method comprises:
determining a defective pixel;
disconnecting an electrical connection between the light-emitting element and the pixel driving circuit of the defective pixel; and
electrically connecting the light-emitting element of the defective pixel to the repair line provided corresponding to the repair driving circuit.

24. A display apparatus, comprising a display panel,
wherein the display panel comprises:

a substrate;

N1 pixel driving circuit rows arranged along a first direction and located on a side of the substrate, wherein each of the pixel driving circuit rows comprises a plurality of pixel driving circuits arranged along a second direction, and the first direction intersects with the second direction;

a plurality of light-emitting elements, each of the plurality of light-emitting elements is electrically connected to one of the pixel driving circuits;

repair lines; and repair driving circuits, wherein along a direction perpendicular to a plane where the substrate is located, each of the repair lines at least partially overlaps with one of the repair driving circuits and also the pixel driving circuits;

wherein each of the repair driving circuits comprises a repair circuit and a first capacitor that are electrically connected, the repair circuit comprises at least two transistors and a second capacitor, and a capacitance of the first capacitor is greater than or equal to a capacitance of the second capacitor; and wherein a number of first capacitors is N2, where both N1 and N2 are positive integers, and N2<2N1.

* * * * *